(12) United States Patent
Lee et al.

(10) Patent No.: US 11,676,907 B2
(45) Date of Patent: Jun. 13, 2023

(54) SEMICONDUCTOR PACKAGE AND ANTENNA MODULE COMPRISING THE SAME

(71) Applicant: SAMSUNG ELECTRONICS CO., LTD., Suwon-si (KR)

(72) Inventors: Yong Koon Lee, Suwon-si (KR); Myung Sam Kang, Suwon-si (KR); Young Gwan Ko, Suwon-si (KR); Young Chan Ko, Suwon-si (KR); Chang Bae Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 17/353,074

(22) Filed: Jun. 21, 2021

(65) Prior Publication Data
US 2021/0313276 A1 Oct. 7, 2021

Related U.S. Application Data

(63) Continuation of application No. 16/570,055, filed on Sep. 13, 2019, now Pat. No. 11,062,999.

(30) Foreign Application Priority Data

Oct. 31, 2018 (KR) .......................... 10-2018-0131681

(51) Int. Cl.
*H01L 21/48* (2006.01)
*H01L 23/538* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
None
See application file for complete search history.

(56) References Cited

U.S. PATENT DOCUMENTS 9,066,424 B2  6/2015  Yang et al.
2005/0122698 A1* 6/2005  Ho .......................... H05K 1/185
                                                    361/764

(Continued)

FOREIGN PATENT DOCUMENTS

KR  10-2017-0112363 A  10/2017
KR  10-2018-0073371 A   7/2018

*Primary Examiner* — Jay C Chang
(74) *Attorney, Agent, or Firm* — Sughrue Mion, PLLC

(57) ABSTRACT

A method including forming a frame having an opening, forming a first metal layer, forming a first encapsulant, forming an insulation layer on the first metal layer, forming a first through-hole and a second through-hole penetrating the insulation layer and the first encapsulant, forming a second metal layer and a third metal layer, forming a second encapsulant, forming a first metal via and a second metal via penetrating the second encapsulant and a metal pattern layer on the second encapsulant, and forming a connection structure. The first metal layer and the second metal layer respectively are formed to extend to a surface of each of the first encapsulant and the frame, facing the metal pattern layer, and the first metal layer and the second metal layer are connected to the metal pattern layer through the first metal via and the second metal via having heights different from each other.

20 Claims, 21 Drawing Sheets

(51) Int. Cl.
    *H01L 23/31*     (2006.01)
    *H01L 23/00*     (2006.01)
    *H01L 25/16*     (2023.01)
    *H01L 23/66*     (2006.01)
    *H01L 23/552*    (2006.01)
    *H01Q 1/38*      (2006.01)
    *H01L 23/13*     (2006.01)

(52) U.S. Cl.
    CPC .......... *H01L 21/4857* (2013.01); *H01L 23/13* (2013.01); *H01L 23/3128* (2013.01); *H01L 23/3135* (2013.01); *H01L 23/5386* (2013.01); *H01L 23/552* (2013.01); *H01L 23/66* (2013.01); *H01L 24/05* (2013.01); *H01L 24/19* (2013.01); *H01L 24/24* (2013.01); *H01L 24/82* (2013.01); *H01L 25/16* (2013.01); *H01Q 1/38* (2013.01); *H01L 2223/6616* (2013.01); *H01L 2223/6677* (2013.01); *H01L 2224/24137* (2013.01); *H01L 2224/24195* (2013.01); *H01L 2224/82101* (2013.01); *H01L 2924/1421* (2013.01); *H01L 2924/19041* (2013.01); *H01L 2924/19042* (2013.01); *H01L 2924/19105* (2013.01); *H01L 2924/3025* (2013.01)

(56) References Cited

U.S. PATENT DOCUMENTS

| | | |
|---|---|---|
| 2008/0036093 A1 | 2/2008 | Tuominen |
| 2017/0287825 A1* | 10/2017 | Lee .................. H01L 24/20 |
| 2017/0347458 A1 | 11/2017 | Lai et al. |
| 2018/0182691 A1 | 6/2018 | Cho et al. |
| 2018/0254252 A1* | 9/2018 | Nakagawa ............ H01L 23/642 |

* cited by examiner

SEMICONDUCTOR PACKAGE AND ANTENNA MODULE COMPRISING THE SAME

CROSS-REFERENCE TO RELATED APPLICATION

This application is a continuation application of U.S. application Ser. No. 16/570,055, filed Sep. 13, 2019, which claims benefit of priority to Korean Patent Application No. 10-2018-0131681 filed on Oct. 31, 2018 in the Korean Intellectual Property Office, the disclosures of each of which are incorporated by reference herein in their entireties.

BACKGROUND

The present disclosure relates to a semiconductor package and an antenna module comprising the same.

With the spread of Information Technology (IT) devices, electronic components have become more complicated, and are changing to an environment capable of high-speed data processing with high performance. In addition, in the case of radio frequency (RF) products, frequency of use is increased, bandwidth is widening, and multi-band is increased. In such an environment, there is a need for a relatively small-sized package or module product to be used to isolate blocks, when they contain components that may cause mutual interference, such as an application processor (AP) chip with a high clock or a high frequency RF chip.

SUMMARY

An aspect of the present disclosure is to provide a semiconductor package and an antenna module, capable of effectively shielding electromagnetic interference between different types of blocks while including a plurality of chips and components, simultaneously improving a heat dissipation effect, minimizing design of a signal path between the antenna and the antenna, securing omnidirectional coverage characteristics, and improving antenna reception sensitivity.

According to an aspect of the present disclosure, a core structure having an opening and a through-hole is provided to realize different types of blocks each including a component and a chip. A metal layer is formed on inner walls of the respective openings and through-holes, metal layers are formed on an encapsulant, a metal via layer is formed to connect the metal layers, thereby preventing electromagnetic interference between the different types of blocks, improving a heat dissipation effect, and facilitating design of a relative compact semiconductor package.

According to an aspect of the present disclosure, a semiconductor package includes a core structure having a first through-hole, the core structure including a frame having an opening, a passive component disposed in the opening, a first encapsulant covering at least a portion of each of the frame and the passive component and filling at least a portion of the opening, a first metal layer disposed on an inner surface of the first through-hole, and a second metal layer disposed on an inner surface of the opening; a first semiconductor chip disposed in the first through-hole, the first semiconductor chip having a first active surface on which a first connection pad is disposed, and a first inactive surface opposite to the first active surface; a second encapsulant covering at least a portion of each of the core structure and the first semiconductor chip, and filling at least a portion of the first through-hole; a connection structure disposed on the core structure and the first active surface, and including a redistribution layer electrically connected to the first connection pad and the passive component; and a metal pattern layer disposed on the second encapsulant. The first and second metal layers are respectively disposed to extend to a surface of each of the first encapsulant and the frame, facing the metal pattern layer, and the first and second metal layers are connected to the metal pattern layer through first and second metal vias having heights different from each other.

According to another aspect of the present disclosure, an antenna module includes the above-described semiconductor package; and an antenna substrate disposed on the semiconductor package. The antenna substrate includes a wiring structure including a feed pattern, and an antenna structure disposed on the wiring structure and including an antenna pattern and a ground pattern, and the semiconductor package and the antenna substrate are connected to each other through a plurality of electrical connection metals disposed between the connection structure and the wiring structure.

According to another aspect of the present disclosure, a semiconductor package includes: a core structure, in which a first semiconductor chip, a second semiconductor chip, and passive components are embedded; a connection structure disposed on a first side of the core structure, covering the first semiconductor chip, the second semiconductor chip, and the passive components, and including a redistribution layer electrically connected to a first connection pad of the first semiconductor chip, a second connection pad of the second semiconductor chip, and the passive component; and a metal pattern layer disposed on a second side of the core structure opposing the first side, and covering the first semiconductor chip, the second semiconductor chip, and the passive components. The core structure includes: a first metal layer surrounding side surfaces of the first semiconductor chip, a second metal layer contacting the first metal layer and surrounding the side surfaces of the first semiconductor chip, a third metal layer surrounding the passive components and side surfaces of the second semiconductor chip, and a fourth metal layer spaced apart from the third metal layer and surrounding the side surfaces the semiconductor chip. The metal pattern layer is electrically connected to each of the first to fourth metal layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
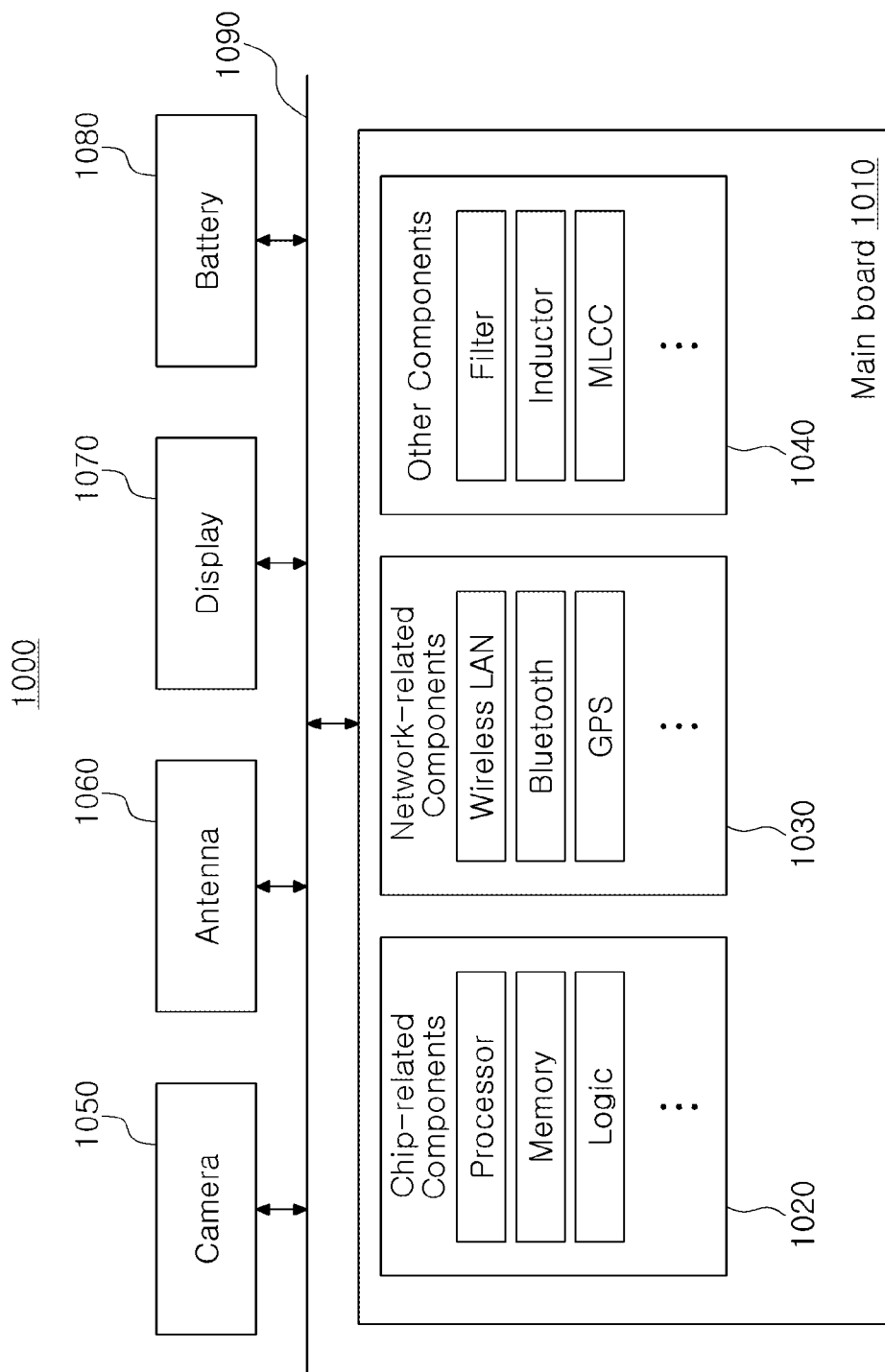
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
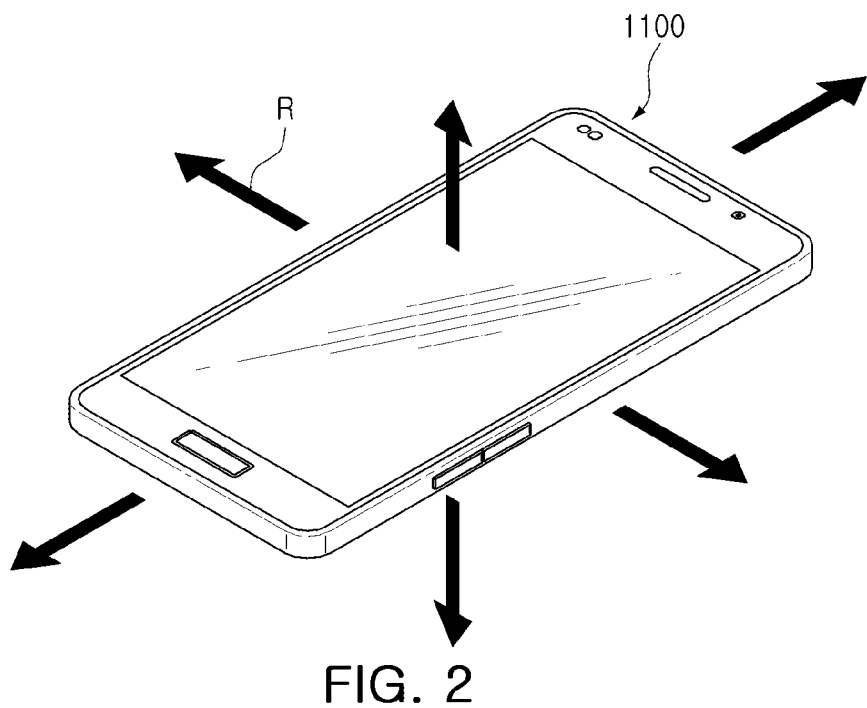
FIG. 2 is a schematic perspective view illustrating an example of an electronic device.

FIG. 2 is a schematic perspective view illustrating an example of an electronic device.

Referring to the drawings, the electronic device may be, for example, a smartphone 1100. In the smartphone 1100, a radio frequency integrated circuit (RFIC) may be applied in the form of a semiconductor package, and an antenna may be applied in the form of a substrate or a module. The radio frequency integrated circuit and the antenna may be electrically connected in the smartphone 1100, such that radiation (R) of the antenna signal in various directions is possible. A substrate or a module including a semiconductor package and an antenna including a radio frequency integrated circuit may be applied to electronic devices such as smartphones in various forms.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
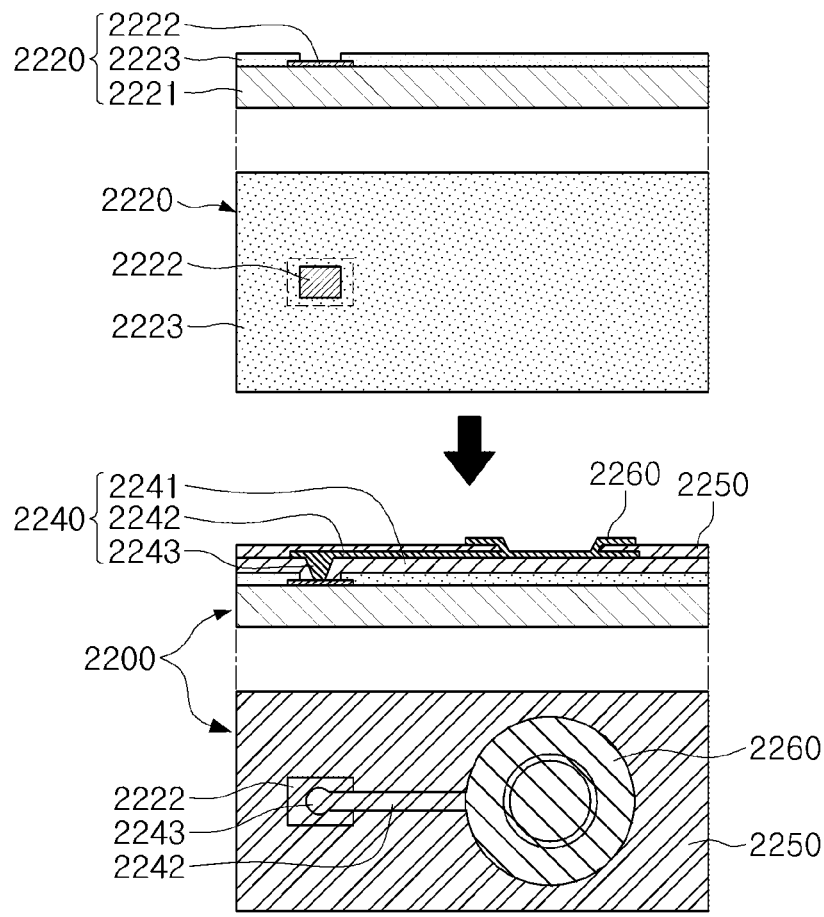
FIGS. 3A and 3B are schematic cross-sectional views illustrating states of a fan-in semiconductor package before and after being packaged.
Figure 3B:
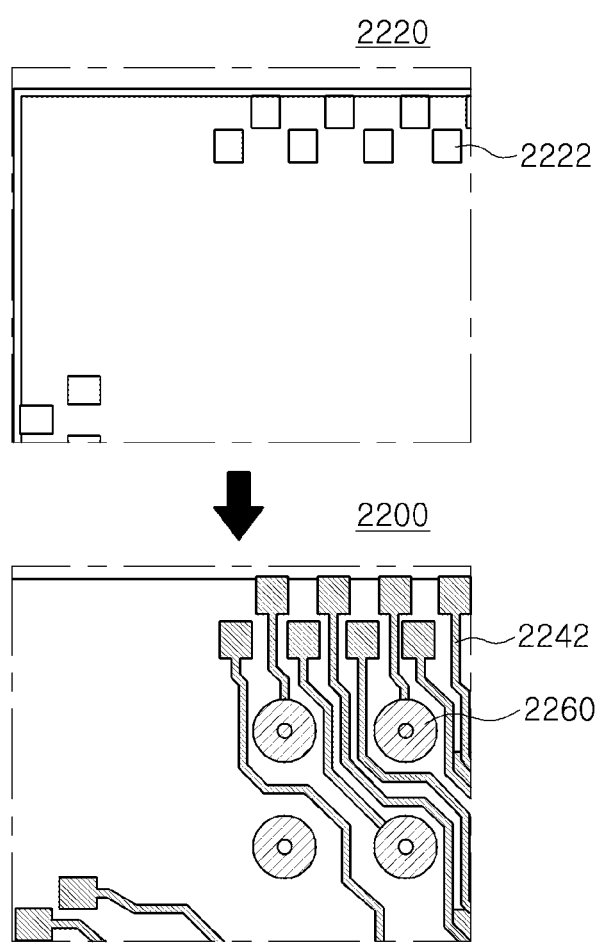

FIGS. 3A and 3B are schematic cross-sectional views illustrating states of a fan-in semiconductor package before and after being packaged.

Figure 4:
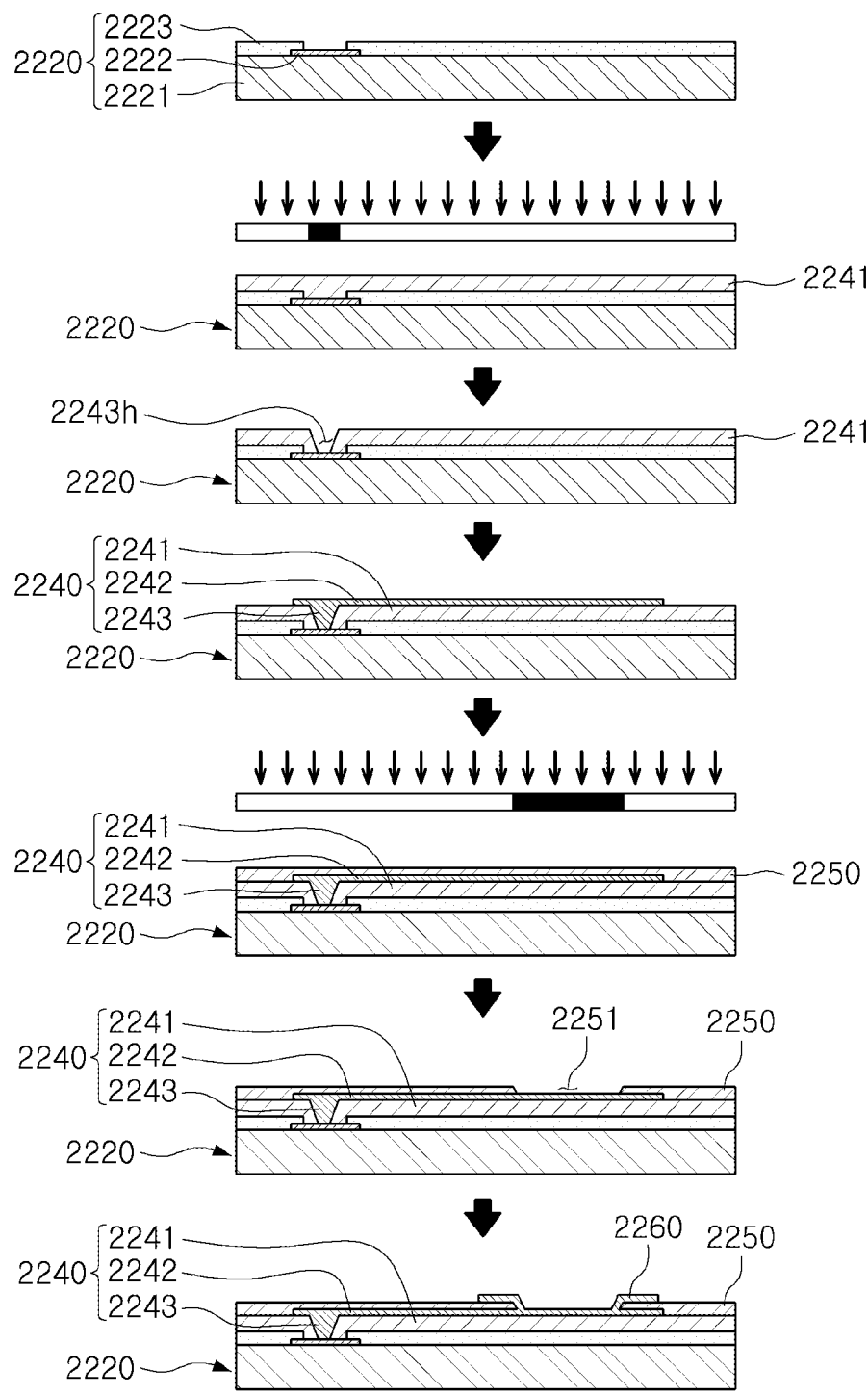
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. For example, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
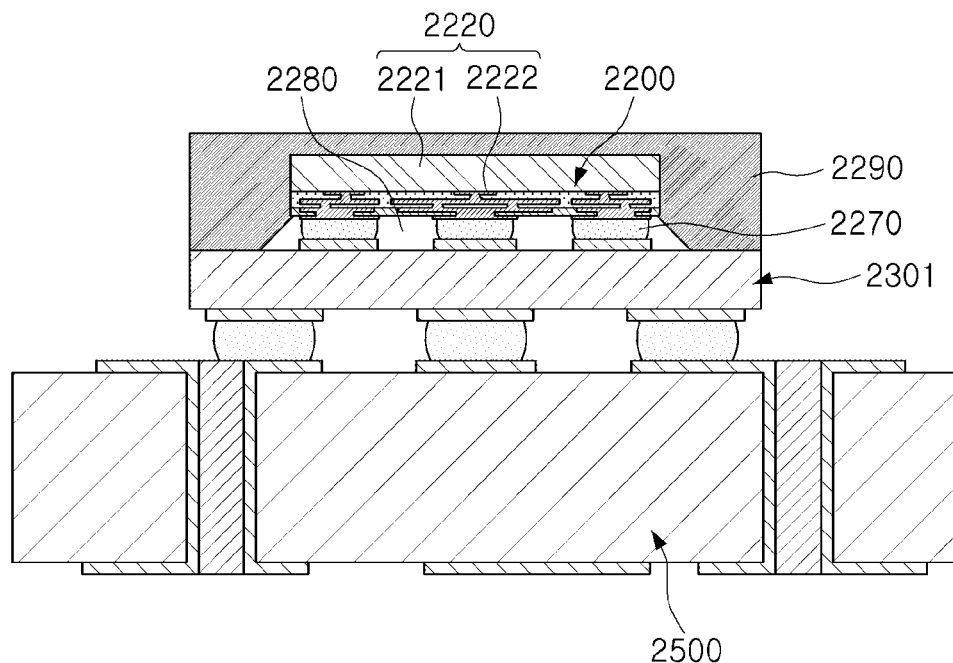
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
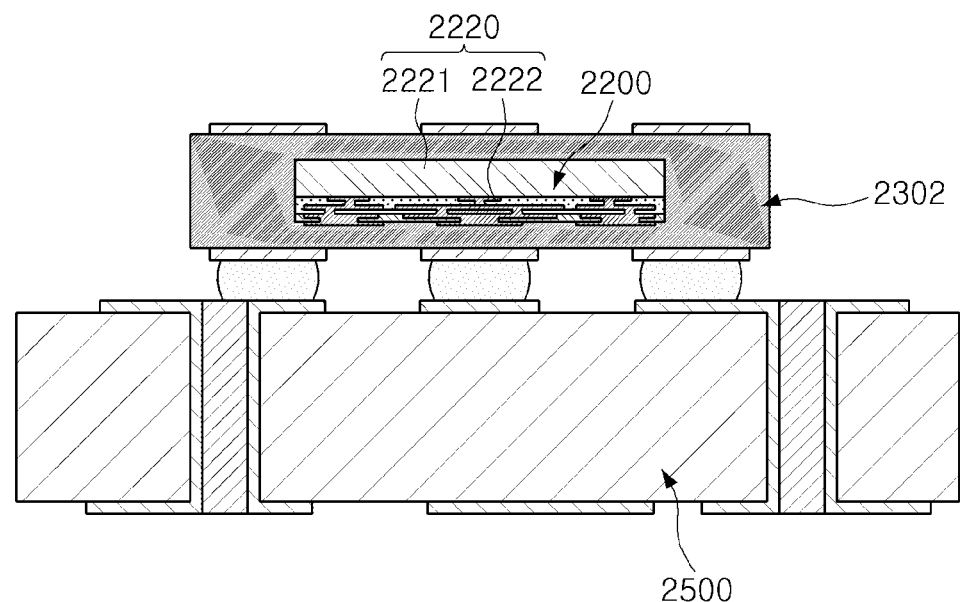
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, for example, I/O terminals, of a semiconductor chip 2220 may be redistributed through a Printed circuit board 2301, and the fan-in semiconductor package 2200 may be ultimately mounted on a mainboard 2500 of an electronic device in a state in which it is mounted on the Printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, for example, I/O terminals, of the semiconductor chip 2220 may be redistributed by the Printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the BGA substrate.

Fan-Out Semiconductor Package

Figure 7:
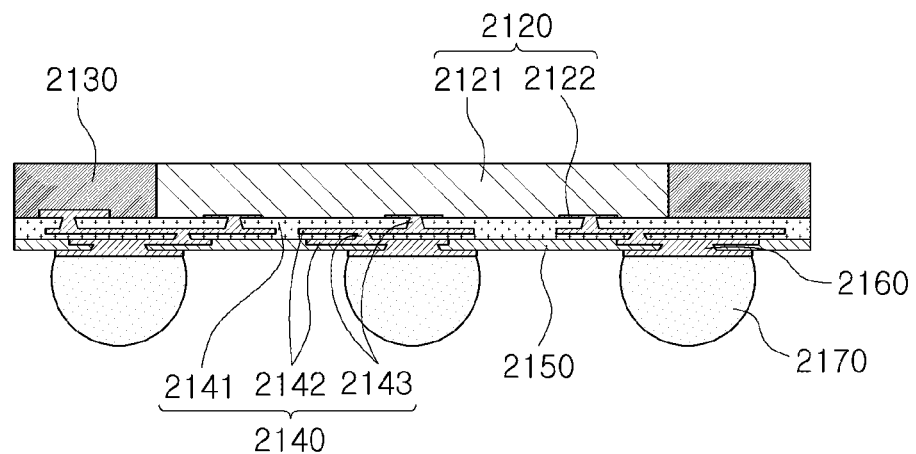
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
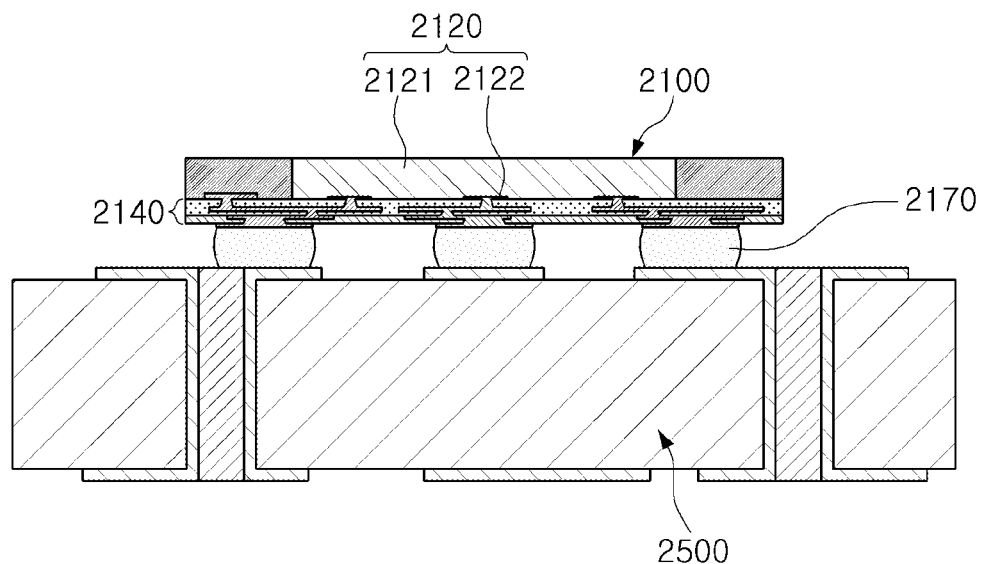
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. For example, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Antenna Module

Figure 9:
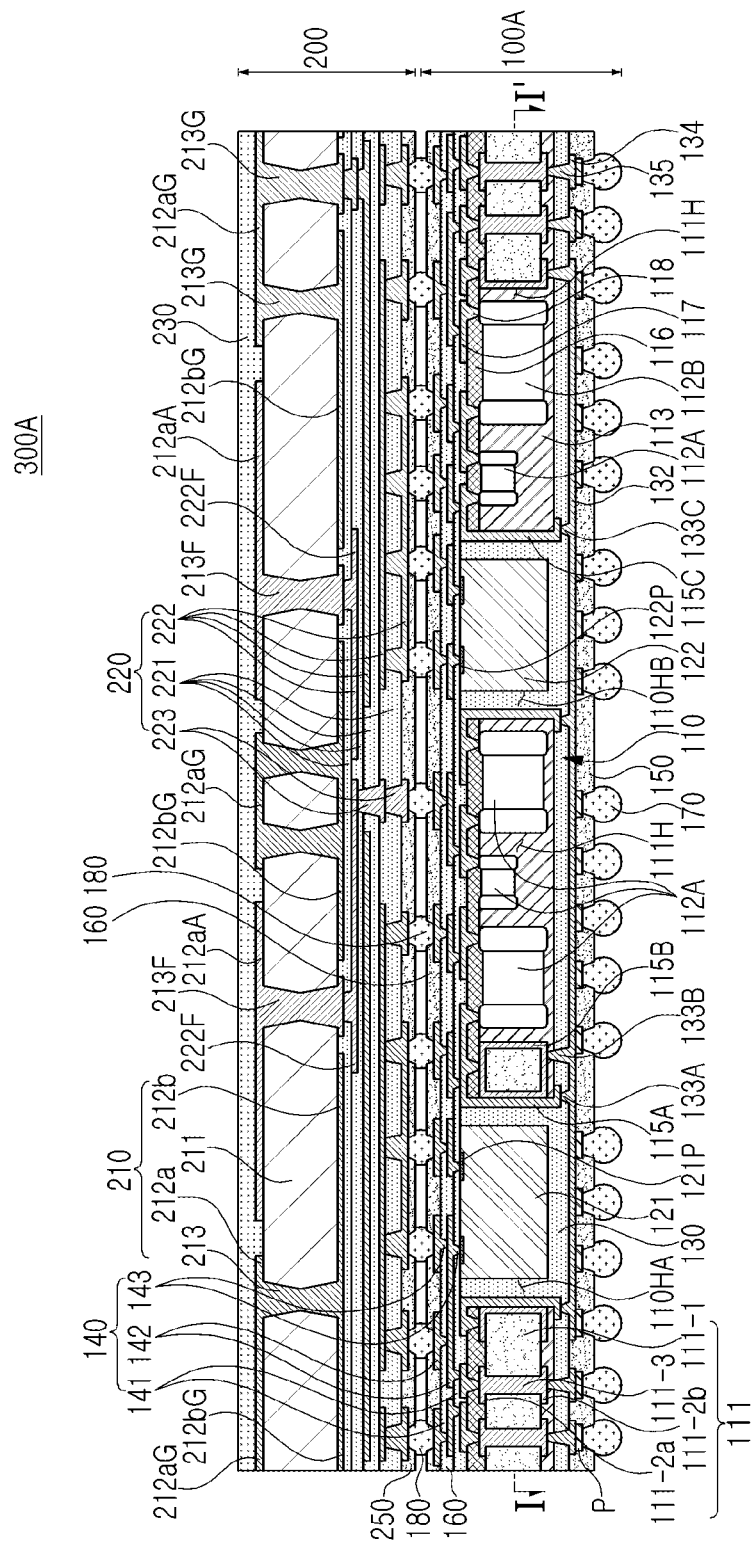
FIG. 9 is a schematic cross-sectional view illustrating an example of an antenna module.

FIG. 9 is a schematic cross-sectional view illustrating an example of an antenna module.

Figure 10:
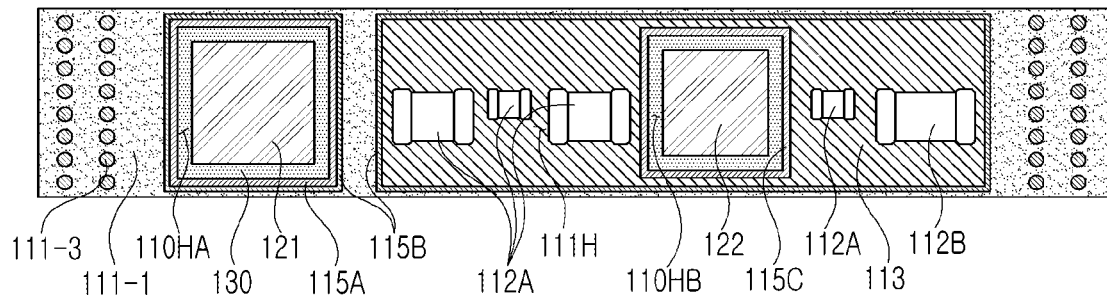
FIG. 10 is a schematic plan view illustrating a semiconductor package applied to the antenna module of FIG. 9 taken along line I-I'.

FIG. 10 is a schematic plan view illustrating a semiconductor package applied to the antenna module of FIG. 9 taken along line I-I'.

Figure 11:
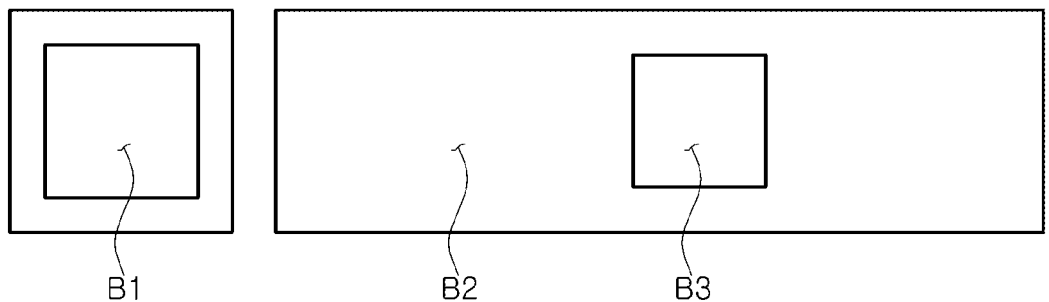
FIG. 11 is a schematic electromagnetic shielding block diagram illustrating a semiconductor package applied to the antenna module of FIG. 9.

FIG. 11 is a schematic electromagnetic shielding block diagram illustrating a semiconductor package applied to the antenna module of FIG. 9.

An antenna module 300A according to an example may include a semiconductor package 100A and an antenna substrate 200 disposed on the semiconductor package 100A. In this case, the semiconductor package 100A and the antenna substrate 200 may be electrically connected to each other through a plurality of second electrical connection metals 180 disposed therebetween.

A semiconductor package 100A according to an example may include a core structure 110 having a first through-hole 110HA; a first semiconductor chip 121 disposed in the first through-hole 110HA, the first semiconductor chip 121 having a first active surface on which a first connection pad 121P is disposed, and a first inactive surface opposite to the first active surface; a second encapsulant 130 covering at least a portion of each of the core structure 110 and the first semiconductor chip 121, and filling at least a portion of the first through-hole 110HA; a connection structure 140 disposed on the core structure 110 and the first active surface of the first semiconductor chip 121, and including a redistribution layer 142 electrically connected to the first connection pad 121P; and a metal pattern layer 132 disposed on the second encapsulant 130.

The core structure 110 may include a frame 111 having an opening 111H; first and second passive components 112A and 112B disposed in the opening 111H and electrically connected to the redistribution layer 142; a first encapsulant 113 covering at least a portion of each of the frame 111 and the first and second passive components 112A and 112B and filling at least a portion of the opening 111H; a first metal layer 115A disposed on an inner surface of the first through-hole 110HA; and a second metal layer 115B disposed on an inner surface of the opening 111H. In this case, the first and second metal layers 115A and 115B may extend to a surface of each of the first encapsulant 113 and the frame 111, facing the metal pattern layer 132, and the first and second metal layers 115A and 115B may be connected to the metal pattern layer 132 through first and second metal vias 133A and 133B having different heights. For example, the metal pattern layer 132 may be disposed on the second encapsulant 130 to cover a region directly above each of the first active surface of the first semiconductor chip 121 and the first and second passive components 112A and 112B, the second encapsulant 130 may cover a surface of the first encapsulant 113 facing the metal pattern layer 132, the first metal via 133A may pass through the second encapsulant 130, the second metal via 133B may pass through the first and second encapsulants 113 and 130, and the second metal via 133B may be higher than the first metal via 133A.

The core structure 110 may further have a second through-hole 110HB disposed in the opening 111H, and may further include a third metal layer 115C disposed on an inner surface of the second through-hole 110HB. A second semiconductor chip 122 having a second active surface on which a second connection pad 122P is disposed, and a second inactive surface opposite to the second active surface, may be disposed in the second through-hole 110HB. The second encapsulant 130 may cover at least a portion of the second semiconductor chip 122 and may fill at least a portion of the second through-hole 110HB. The connection structure 140 may be disposed on the active surface of the second semiconductor chip 122, and the redistribution layer 142 may be electrically connected to the second connection pad 122P. The metal pattern layer 132 may be disposed on the second encapsulant 130 to cover a region directly above the second inactive surface of the second semiconductor chip 122. The third metal layer 115C may extend to a surface of the first encapsulant 113 facing the metal pattern layer 132, and a third metal via 133C may connect the third metal layer 115C and the metal pattern 132. The third metal via 133C, similar to the first metal layer 133A, may penetrate only the second encapsulant 130, and may have a height the same as or substantially the same as that of the first metal layer 133A.

As described above, in a semiconductor package 100A according to an example, different types of blocks B1, B2, and B3 may include the first semiconductor chip 121, the second semiconductor chip 122, and the first and second passive components 112A and 112B, respectively, and may be realized through the first through-hole 110HA, the second through-hole 110HB, and the opening 111H, respectively. In this case, the different types of blocks B1, B2, and B3 may be isolated from each other by the first and third metal layers 115A and 115C formed on inner walls of the first and second through-holes 110HA and 110HB, the second metal layer 115B formed on an inner wall of the opening 111H, the metal pattern layer 132 formed on the encapsulant 130, and the first and second metal vias 133A and 133B connecting them. Therefore, the mutual electromagnetic interference may be effectively blocked, and the heat dissipation effect may also be improved.

A semiconductor package 100A according to an example may have a configuration in which first and second passive components 112A and 112B are embedded in a core structure 110 for compact design. In this case, a block B1 in which the semiconductor chip 121 is disposed may be spaced apart from a block B2 in which the first and second passive components 112A and 112B are disposed at a predetermined distance, to shield electromagnetic wave through first and second metal layers 115A and 115B constituting multiple layers such as two (2), three (3) or more layers disposed between the blocks B1 and B2. In a case of a block B3 in which the second semiconductor chip 122 in which it is important to shorten a signal path between the first and second passive components 112A and 112B is disposed, the first and second passive components 112A and 112B may be disposed in the block B2, but may shield electromagnetic wave through a third metal layer 115C. The design may be optimized in relation to the first and second passive components 112A and 112B, depending on types of the first and second semiconductor chips 121 and 122. In one example, the first semiconductor chip 121 may include a radio frequency integrated circuit (RFIC), the second semiconductor chip 122 may include a power management integrated circuit (PMIC), and the first and second passive components 112A and 112B may include a capacitor 112A and/or an inductor 112B.

The second metal layer 115B may also be disposed on an outer surface of a frame 111 with respect to an opening 111H. In this case, at least a portion of an inner surface of a first through-hole 110HA may be the second metal layer 115B. The second metal layer 115B may have an extension porting disposed on an upper surface and/or a lower surface of a portion of the core layer 111-1 as a separation wall of the first through-hole 110HA and the opening 111H. In this regard, thicknesses of portions of the second metal layer 115B disposed on the inner surface of the first through-hole 110HA and on the inner surface of the opening 111H may be the same as or substantially the same as each other. Therefore, the second metal layer 115B on the inner surface of the first through-hole 110HA may be physically in contact with the first metal layer 115A. In this case, electromagnetic shielding and heat dissipation effect of the block B1 in which the first semiconductor chip 121 is disposed may be further maximized, and adhesive force between a core structure 110 and the first metal layer 115A may be made more excellent. The second metal layer 115B may be physically spaced apart from the third metal layer 115C by a predetermined distance in the opening 111H, and a first encapsulant 113 may be disposed between the second and third metal layers 115B and 115C. In this case, electromagnetic wave shielding design of the different types of blocks B2 and B3 in the core structure 110 is more compactly possible.

The core structure 110 may further include an insulation layer 116 disposed on surfaces of the first and second passive components 112A and 112B facing the connection structure 140, a wiring layer 117 disposed on the insulation layer 116, and a wiring via 118 passing through the insulation layer 116 and electrically connecting the wiring layer 117 to the first and second passive components 112A and 112B. In this case, first and second active surfaces of the first and second semiconductor chips 121 and 122 and surfaces of the wiring layer 117 contacting the connection structure 140 may be coplanar with each other. Since first and second through-holes 110HA and 110HB may also pass through the insulation layer 116, a depth of the first and second through-holes 110HA and 110HB may be deeper than that of the opening 111H passing through only the frame 111. Therefore, bottom surfaces of the first and second through-holes 110HA and 110HB may have a step difference from a bottom surface of the opening 111H, such that first and second active surfaces of each of the first and second semiconductor chips 121 and 122, and surfaces of the wiring layer 117 contacting the connection structure 140 may be coplanar with each other.

A material of the insulation layer 116 may be selected regardless of the first and second semiconductor chips 121 and 122. For example, a non-photosensitive insulating material including an inorganic filler that may be not a photo-imagable dielectric (PID), for example, Ajinomoto Build-up Film (ABF), or the like, may be used. This film type of non-photosensitive insulating material may be excellent in flatness, such that undulation and cracking problems caused by protruded electrodes of the first and second passive components 112A and 112B may be improved. This non-photosensitive insulating material may also form an opening by a laser via. Even when a material of the first encapsulant 113 is blood onto electrodes of the first and second passive components 112A and 112B, the electrodes may be opened effectively by the laser via. Therefore, the problem caused by the electrode open failure may also be solved.

In addition, as the insulation layer 141 of the connection structure 140, a photoimagable dielectric (PID) may be used in a similar manner to the conventional case. In this case, since a fine pitch may be introduced through a photo via, tens to millions of the first and second connection pads 121P and 122P of the first and second semiconductor chips 121 and 122 may be redistributed very effectively in a similar manner to the conventional case. Since it is possible to selectively control a material of the insulation layer 116 on which the wiring layer 117 and the wiring via 118 are formed, and a material of the insulation layer 141 on which the redistribution layer 142 and the connection via 143 are formed, an excellent synergy effect may be exerted.

Ina semiconductor package 100A according to an example, a plurality of first and second passive components 112A and 112B together with first and second semiconductor chips 121 and 122 may be disposed in a single package to be modularized. Therefore, since interval between components may be minimized, it is possible to minimize amounting area on a printed circuit board such as a main board. In addition, since the electrical path between the first and second semiconductor chips 121 and 122 and the first and second passive components 112A and 112B may be minimized, noise problem may be solved. The first and second passive components 112A and 112B may be first encapsulated with a first encapsulant 113, and then the first and second semiconductor chips 121 and 122 may be encapsulated with a second encapsulant 130. The yield problem of the first and second semiconductor chips 121 and 122 due to poor mounting of the first and second passive components 112A and 112B may be solved through two (2) or more encapsulations (113 and 130). Further, influence of foreign matter on the first and second semiconductor chips 121 and 122 by mounting and encapsulating the first and second passive components 112A and 112B may be minimized.

Next, an antenna substrate 200 according to an example may include an antenna structure 210 in which a first pattern layer 212a including an antenna pattern 212aA is disposed on an upper surface of a dielectric layer 211, a second pattern layer 212b including a ground pattern 212bG is disposed on a lower surface of the dielectric layer 211, and a conductor via layer 213, including a feed line via 213F passing through the dielectric layer 211 and electrically connected to the antenna pattern 212aA, is formed in the dielectric layer 211; and a wiring structure 220 disposed below the antenna structure 210 and including a wiring layer 222 including a feed pattern 222F electrically connected to the feed line via 213F. The antenna structure 210 may be thicker than the wiring structure 220.

When an antenna may be formed of a single composite module together with an RFIC, it is necessary to consider how to implement an antenna, a ground, a dielectric material, a feed line, etc. to determine resonance frequency and bandwidth of the antenna. For example, a distance between the antenna and the ground, which affects the antenna characteristics sensitively, for example, a thickness of an air layer or a thickness of a dielectric material should be constantly maintained to ensure stable radiation characteristics of the antenna.

In the conventional method, an antenna may be formed on a redistribution layer of a semiconductor package, but a ground may be formed on the main board. In this case, a thickness or a distance between the antenna and the ground should be secured to a height of a solder ball of the package. There may be a problem in that when the package is mounted on the main board, difference in thickness may occur depending on the height of the solder ball. In this case, since an air layer may be used as a dielectric material, a size of the antenna may disadvantageously be increased. Further, in this case, flux or foreign matter may be inserted into space between the antenna and the ground, and as a result, the characteristics of the antenna may be greatly affected. Further, in this case, when heat is generated in the RFIC, since it is difficult to secure a sufficient heat dissipation path, there is a limitation in application to a device using relatively large amounts of electric power.

In a case of an antenna module 300A according to an example, a semiconductor package 100A in which first and second semiconductor chips 121 and 122, such as an RFIC and/or a PMIC, are packaged in a face-up form, may be connected to an antenna substrate 200 including an antenna pattern 212aA such as a patch antenna or the like in the form of a package on package (POP). In this case, an antenna structure 210 introduced to the antenna substrate 200 may have an antenna pattern 212aA and a ground pattern 212bG on both sides with respect to a dielectric layer 211, and a feed line via 213F may be realized by a conductor via layer 213 and the like passing through the dielectric layer 211. Therefore, a distance between the antenna pattern 212aA and the ground pattern 212bG in the antenna module 300A may be stably secured regardless of changes in an external environment, such that the radiation characteristic of the antenna pattern 212aA may be maintained. Nevertheless, a signal path between the antenna pattern 212aA and the first and second semiconductor chips 121 and 122 may be minimized to ensure stable RF characteristics and the like.

A dielectric constant (Dk) of the dielectric layer 211 of the antenna structure 210 of the antenna substrate 200 and a dielectric constant (Dk) of the frame 111 of the core structure 110 of the semiconductor package 100A may be appropriately used, to simplify a structure of the entire module, thereby increasing spatial efficiency and reducing costs at the same time. Further, decrease in performance of the antenna pattern 212aA due to influence of a foreign matter in a space between the antenna pattern 212aA and the ground pattern 212bG may be prevented. In addition, rigidity of the antenna module 300A may be added by introducing the core structure 110, and the core structure 110 may provide an electrical connection path. Therefore, a signal path for connecting to a mainboard and the like in the antenna module 300A up to the first electrical connection metal 170 may effectively be provided. In addition, since the first and second passive components 112A and 112B together with the first and second semiconductor chips 121 and 122 may be embedded in the semiconductor package 100A, loss of signals, power, and the like, may also be minimized.

Hereinafter, components of an antenna module 300A will be described in more detail with reference to the drawings.

First, as described above, a semiconductor package 100A according to an example may include a core structure 110 including a frame 111, first and second passive components 112A and 112B, a first encapsulant 113, first to third metal layers 115A, 115B, and 115C, an insulation layer 116, a wiring layer 117, and a wiring via 118, first and second semiconductor chips 121 and 122, a second encapsulant 130, a metal pattern layer 132, first to second metal vias 133A, 133B, and 133C, and a connection structure 140. In addition, a semiconductor package 100A according to an example may further include a backside wiring layer 134, a backside wiring via 135, a first passivation layer 150, a second passivation layer 160, a first electrical connection metal 170, and a second electrical connection metal 180. The term "backside" used here may be determined based on the first and second semiconductor chips 121 and 122, for example, refers to a side in which the first and second inactive surfaces face, and, hereinafter, it is applied in a similar manner as described above.

The core structure 110 may basically have a first through-hole 110HA. In the first through-hole 110HA, the first semiconductor chip 121 may be disposed to be spaced apart from a wall surface of the first through-hole 110HA at a predetermined distance. The first through-hole 110HA may be formed to completely pass through the core structure 110, and the wall surface of the first through-hole 110HA may be continuously formed to surround the first semiconductor chip 121. This is merely an example, and a shape of the first through-hole 110HA may be variously modified in other forms.

The core structure 110 may include a frame 111 having an opening 111H, first and second passive components 112A and 112B disposed in the opening 111H and electrically connected to a redistribution layer 142, a first encapsulant 113 covering at least a portion of each of the frame 111 and the first and second passive components 112A and 112B and filling at least a portion of the opening 111H, a first metal layer 115A disposed on an inner surface of a first through-hole 110HA, and a second metal layer 115B disposed on an inner surface of the opening 111H and disposed to extend to upper and lower surfaces of the frame 111.

The frame 111 may include a plurality of core wiring layers 111-2a and 111-2b, and may reduce the number of layers of the redistribution layer 142 of the connection structure 140. The frame 111 may include a core wiring via layer 111-3 electrically connecting the core wiring layers 111-2a and 111-2b, and may also function as a connection structure for electrical connection in a vertical direction. In accordance with a specific material of a core layer 111-1, rigidity of the semiconductor package 100A may be further improved, and function of securing uniformity of a thickness of the first encapsulant 113 may be performed. The frame 111 may have an opening 111H, and passive components 112A and 112B may be disposed from a wall surface of the opening 111H at a predetermined distance in the opening 111H. The opening 111H may be formed to completely pass through the frame 111, and the wall surface of the opening 111H may be formed continuously to surround the passive components 125A and 125B. This is merely an example, and shapes of the frame 111 and the opening 111H may be variously modified in different forms.

The frame 111 may include a core layer 111-1, a first core wiring layer 111-2a disposed on an upper surface of the core layer 111-1, a second core wiring layer 111-2b disposed on a lower surface of the core layer 111-1, and a core wiring via layer 111-3 passing through the core layer 111-1 and connecting the first and second core wiring layers 111-2a and 111-2b. A wiring structure such as the core wiring via layer 111-3, may be spaced apart from the portion of the core layer 111-1 as the separation wall of the first through-hole 110HA and the opening 111H. The first and second core wiring layers 111-2a and 111-2b of the frame 111 may be thicker than the redistribution layer 142 of the connection structure 140, although not illustrated in detail in the drawing. The first and second core wiring layers 111-2a and 111-2b of the frame 111 may be formed in a relatively large size through a substrate process, in accordance with scales of the first and second semiconductor chips 121 and 122. The redistribution layer 142 of the connection structure 140 may be formed in a relatively small size for fine design and high density design.

A material of the core layer 111-1 is not particularly limited. For example, an insulating material may be used. As the insulating material, a thermosetting resin such as an epoxy resin, a thermoplastic resin such as polyimide, or a glass fiber, a glass cloth, or a glass fabric, together with an inorganic filler, such as a prepreg, ABF, FR-4, bismaleimide triazine (BT), or the like may be used. As necessary, a photoimagable dielectric (PID) resin may be used. For example, as the material of the core layer 111-1, conventional copper clad laminate (CCL) of Low Df & Low Dk, or glass-based or ceramic-based insulating material of Low Df & High Dk may be applied, depending on required material properties.

The first and second core wiring layers 111-2a and 111-2b may perform a role of redistributing the connection pads 121P and 122P of the first and second semiconductor chips 121 and 122. In addition, the semiconductor package 100A may be used as a connection pattern when electrically connecting the semiconductor package 100A to other components in a vertical direction. As the material for forming the first and second core wiring layers 111-2a and 111-2b, a metal material such as copper (Cu), aluminum (Al), silver (Ag), tin (Sn), gold (Au), nickel (Ni), lead (Pb), titanium (Ti), or alloys thereof may be used. The first and second core wiring layers 111-2a and 111-2b may perform various functions, depending on a desired design of the layer. For example, a ground (GND) pattern, a power (PWR) pattern, a signal (S) pattern, and the like, may be included. Here, the signal (S) pattern may include various signals except for aground (GND) pattern, a power (PWR) pattern, and the like, for example, a data signal and the like. Further, via pads and the like may be included.

The core wiring via layer 111-3 may electrically connect the first and second core wiring layers 111-2a and 111-2b formed on different layers, to form an electrical path in the frame 111. As a material for forming the core wiring via layer 111-3, a metal material such as copper (Cu), aluminum (Al), silver (Ag), tin (Sn), gold (Au), nickel (Ni), lead (Pb), titanium (Ti), or alloys thereof may be used. The core wiring via layer 111-3 may also be a field type via completely filled with a metal material, or a conformal type via in which a metal material is formed along a wall surface of a via hole. Further, any known shape such as an hourglass shape or a cylindrical shape may be applied. The core wiring via layer 111-3 may also include vias for signals, vias for ground, and the like.

The first and second passive components 112A and 112B may be disposed in the opening 111H, and disposed in parallel with the first and second semiconductor chips 121 and 122. The first and second passive components 112A and 112B may be known passive components such as capacitors, inductors, and the like. As a non-limiting example, the first passive component 112A may be a capacitor, and the second passive component 112B may be an inductor. The first and second passive components 112A and 112B may be electrically connected to the first and second semiconductor chips 121 and 122 through the redistribution layer 142 of the connection structure 140. Also, they may be electrically connected to the antenna substrate 200 through the connection structure 140. The number of the first and second passive components 112A and 112B is not particularly limited.

The first encapsulant 113 may be a structure for protecting the frame 111, the first and second passive components 112A and 112B, and the like, and providing an insulating region. The encapsulation form is not particularly limited, may cover at least a portion of each of the frame 111 and the first and second passive components 112A and 112B, and may fill at least a portion of the opening 111H. A material of the first encapsulant 113 is not particularly limited. For example, ABF or a photo imageable encapsulant (PIE) may be used, but is not limited thereto.

The first and second metal layers 115A and 115B may be formed on the entire inner surfaces of the first through-hole 110HA and the opening 111H, respectively, to surround the first semiconductor chip 121 and the first and second passive components 112A and 112B. Further, the first metal layer 115A may extend to upper and lower surfaces of the core structure 110, for example, a lower surface of the first encapsulant 113 and an upper surface of the insulation layer 116. The second metal layer 115B may extend to upper and lower surfaces of the frame 111, for example, upper and lower surfaces of the core layer 111-1. The second metal layer 115B may be formed on an outer surface of the frame 111, for example, on an outer surface of the core layer 111-1. As a result, the heat dissipation characteristics may be improved, and the electromagnetic wave shielding effect may be exerted. As a material for forming the first and second metal layers 115A and 115B, a metal material such as copper (Cu), aluminum (Al), silver (Ag), tin (Sn), gold (Au), nickel (Ni), lead (Pb), titanium (Ti), or alloys thereof may be used. The first and second metal layers 115A and 115B may be electrically connected to the ground pattern of the first core wiring layer 111-2a and/or the second core wiring layer 111-2b, and the ground pattern of the redistribution layer 142, to be used as a ground plane.

The core structure 110 may further include an insulation layer 116 disposed on surfaces of the first and second passive component 112A an 112B facing the connection structure 140, a wiring layer 117 disposed on the insulation layer 116, and a wiring via 118 passing through the insulation layer 116 and electrically connecting the wiring layer 117 to the first and second passive components 112A and 112B. In this case, a first active surface of the first semiconductor chip 121 and a surface of the wiring layer 117 contacting the connection structure 140 may be coplanar with each other. For example, since the first and second through-holes 110HA and 110HB may also pass through the insulation layer 116, a depth of the first and second through-holes 110HA and 110HB may be deeper than that of the opening 111H passing through only the frame 111. Therefore, bottom surfaces of the first and second through-holes 110HA and 110HB may have a step difference from the bottom surface of the opening 111H, such that the first and second active surfaces of each of the first and second semiconductor chips 121 and 122, and surfaces of the wiring layer 117 contacting the connection structure 140 may be coplanar with each other.

The core structure 110 may further have a second through-hole 110HB formed in the opening 111H. In the second through-hole 110HB, the second semiconductor chip 122 may be disposed to be spaced apart from a wall surface of the second through-hole 110HB at a predetermined distance. The second through-hole 110HB may be formed to completely pass through the core structure 110, and the wall surface of the second through-hole 110HB may be formed continuously to surround the second semiconductor chip 122. This is merely an example, and a shape of the second through-hole 110HB may be variously modified in other forms.

The core structure 110 may further include a third metal layer 115C disposed on the inner surface of the second through-hole 110HB. The third metal layer 115C may be formed on the entire inner surface of the second through-hole 110HB to surround the second semiconductor chip 122. Further, the third metal layer 115C may extend to upper and lower surfaces of the core structure 110, for example, to a lower surface of the first encapsulant 113 and an upper surface of the insulation layer 116. As a material for forming the third metal layer 115C, a metal material such as copper (Cu), aluminum (Al), silver (Ag), tin (Sn), gold (Au), nickel (Ni), lead (Pb), titanium (Ti), or alloys thereof may be used. The third metal layer 115C may be electrically connected to the ground pattern of the first core wiring layer 111-2a and/or the second core wiring layer 111-2b, and the ground pattern of the redistribution layer 142, to be used as a ground plane. A thickness of the third metal layer 115C and a thickness of the first metal layer 115A may be the same as or substantially the same as each other.

At least a portion of the second metal layer 115B may constitute an inner surface of the first through-hole 110HA. In this case, the first and second metal layers 115A and 115B may physically contact each other on the inner surface of the first through-hole 110HA. In the opening 111H, the second and third metal layers 115B and 115C may be physically spaced apart from each other at a predetermined distance, and most of the space therebetween may be filled with the first encapsulant 113. The first and third metal layers 115A and 115C may extend respectively lower than the second metal layer 115B, with respect to the lower surface of the core layer 111-1 of the frame 111, and may extend respectively higher than the second metal layer 115B, with respect to the upper surface of the core layer 111-1 of the frame 111. As necessary, the first and third metal layers 115A and 115C may be thicker than the second metal layer 115B, but are not limited thereto.

The first semiconductor chip 121 may be an integrated circuit (IC), in a bare state, in which hundreds to millions of devices are integrated into one chip. As necessary, the first semiconductor chip 121 may be a packaged integrated circuit (IC). The integrated circuit (IC) may be, for example, a radio-frequency integrated circuit (RFIC). For example, an antenna module 300A according to an example may be a composite module including an RFIC and an mmWave/5G antenna. The first semiconductor chip 121 may include a body having various circuits formed therein, and a first connection pad 121P may be formed on the active surface of the body. The body may be formed based on, for example, an active wafer. In this case, silicon (Si), germanium (Ge), gallium arsenide (GaAs) or the like may be used as the base material. The first connection pad 121P may be for electrically connecting the first semiconductor chip 121 to other components. The first connection pad 121P may be formed of a metal material, preferably copper (Cu) or aluminum (Al), but is not limited thereto. In the first semiconductor chip 121, the surface on which the first connection pad 121P may be disposed may be the first active surface and the opposite side may be the first inactive surface. On the first active surface of the first semiconductor chip 121, a passivation film composed of an oxide film and/or a nitride film, etc., having grooves exposing at least a portion of the first connection pads 121P may be formed. In this case, determination of positional relationship with other components of the first active surface may be based on the passivation film. The first semiconductor chip 121 may be arranged in a face-up form, and thus may have a minimum signal path with the antenna pattern 212aA to be described later.

The second semiconductor chip 122 may also be an integrated circuit (IC), in a bare state, in which hundreds to millions of devices are integrated into one chip. As necessary, the second semiconductor chip 122 may be a packaged integrated circuit (IC). The integrated circuit (IC) may be, for example, a PMIC (Power Management Integrated Circuit). For example, an antenna module 300A according to an example may be a complex module including both an RFIC and a PMIC. The second semiconductor chip 122 may include a body having various circuits formed therein, and a second connection pad 122P may be formed on the active surface of the body. The body may be formed based on, for example, an active wafer. In this case, silicon (Si), germanium (Ge), gallium arsenide (GaAs) or the like may be used as the base material. The second connection pad 122P may be for electrically connecting the second semiconductor chip 122 to other components. The second connection pad 122P may be formed of a metal material, preferably copper (Cu) or aluminum (Al), but is not limited thereto. A surface of the second semiconductor chip 122 on which the second connection pad 122P is disposed may become a second active surface, and a surface opposite thereto becomes a second inactive surface. On the second active surface of the second semiconductor chip 122, a passivation film composed of an oxide film and/or a nitride film, etc., having a groove exposing at least a portion of the second connection pad 122P may be formed. In this case, determination of positional relationship with other components of the second active surface may be based on the passivation film. The second semiconductor chip 122 may be arranged in a face-up form, and thus may have a minimum signal path with the ground pattern 212bG to be described later.

The second encapsulant 130 may be a structure for protecting the core structure 110, the first and second semiconductor chips 121 and 122, and the like, and providing an insulating region. The encapsulation form is not particularly limited, may cover at least a portion of each of the core structure 110 and the first and second semiconductor chips 121 and 122, and may fill at least a portion of each of the first and second through-holes 110HA and 110HB. A material of the second encapsulant 130 is not particularly limited. For example, ABF or PIE may be used, but is not limited thereto.

The metal pattern layer 132 may effectively block the electromagnetic wave shielding of the first and second semiconductor chips 121 and 122, and the first and second passive components 112A and 112B to the backsides thereof, to isolate each of the blocks B1, B2, and B3. The metal pattern layer 132 may also improve the heat dissipation effect of the first and second semiconductor chips 121 and 122, and the first and second passive components 112A and 112B to the backsides thereof. For this, the metal pattern layer 132 may be disposed, in a plate form, to cover first and second inactive surfaces of the first and second semiconductor chips 121 and 122 and a region directly above each of the first and second passive components 112A and 112B on the second encapsulant 130. For example, the metal pattern layer 132 may be in the form of a single plate, and may be in the form of a plurality of plates, as necessary. As the material for forming the metal pattern layer 132, a metal material such as copper (Cu), aluminum (Al), silver (Ag), tin (Sn), gold (Au), nickel (Ni), lead (Pb), titanium (Ti), or alloys thereof may be used. The metal pattern layer 132 may be electrically connected to the ground pattern of the first core wiring layer 111-2a and/or the second core wiring layer 111-2b, and the ground pattern of the redistribution layer 142, to be used as a ground plane. The metal pattern layer 132 may also provide a pad for the first electrical connection metal 170. In this case, the first electrical connection metal 170 connected to the metal pattern layer 132 may be provided for power or ground.

The first to third metal vias 133A, 133B, and 133C may connect the first to third metal layers 115A, 115B, and 115C to the metal pattern layer 132 to effectively block the electromagnetic wave shielding of the first and second semiconductor chips 121 and 122 and the first and second passive components 112A and 112B to the backsides thereof, thereby isolating each of the blocks B1, B2, and B3. Also, the heat dissipation effect of the first and second semiconductor chips 121 and 122 and the first and second passive components 112A and 112B to the backsides thereof may be improved as well. The first and second metal vias 133A and 133B may have a step difference therebetween and the third and second metal vias 133C and 133B may have a step difference therebetween. For example, the second metal via 133B may extend higher than the first metal via 133A and the third metal via 133C, with respect to the metal pattern layer 132. Further, the first to third metal vias 133A, 133B, and 133C may be in the form of a line via having a predetermined length filled with a metal material in a via hole formed in the form of a trench, and the first to third metal layers 115A, 115B, and 115C may be connected to the metal pattern layer 132. Therefore, the electromagnetic wave shielding effect may be further improved. As the material for forming the first to third metal vias 133A, 133B, and 133C, a metal material such as copper (Cu), aluminum (Al), silver (Ag), tin (Sn), gold (Au), nickel (Ni), lead (Pb), titanium (Ti), or alloys thereof may be used. The first to third metal vias 133A, 133B, and 133C may be electrically connected to the ground pattern of the first core wiring layer 111-2a and/or the second core wiring layer 111-2b, and the ground pattern of the redistribution layer 142, to be used as a ground plane.

The backside wiring layer 134 may be electrically connected to the first and second core wiring layers 111-2a and 111-2b of the frame 111 of the core structure 110, and may serve as pads connected to those of the first electrical connection metal 170 for signals. When an antenna module 300A is mounted on a main board or the like, the backside wiring layer 134 may provide a connection path of signals. The backside wiring layer 134 may redistribute the first and second connection pads 121P and 122P of the first and second semiconductor chips 121 and 122. As the material for forming the backside wiring layer 134, a metal material such as copper (Cu), aluminum (Al), silver (Ag), tin (Sn), gold (Au), nickel (Ni), lead (Pb), titanium (Ti), or alloys thereof may be used. The backside wiring layer 134 may perform various functions, depending on a desired design. For example, a signal pattern and the like may be included. Further, via pads, electrical connection metal pads, and the like may also be included.

The backside wiring via 135 may electrically connect the backside wiring layer 134 formed on the different layers to the second core wiring layer 111-2b and the like. As a material for forming the backside wiring via 135, a metal material such as copper (Cu), aluminum (Al), silver (Ag), tin (Sn), gold (Au), nickel (Ni), lead (Pb), titanium (Ti), or alloys thereof may be used. The backside wiring via 135 may also be a field type via completely filled with a metal material, or a conformal type via in which a metal material is formed along a wall surface of a via hole. Also, a shape of backside wiring via 135 may be a tapered shape in a direction opposite to the connection via 143 of the connection structure 140.

The connection structure 140 may redistribute the first and second connection pads 121P and 122P of the first and second semiconductor chips 121 and 122. The first and second connection pads 121P and 122P of the first and second semiconductor chips 121 and 122 may be electrically connected to the first and second passive components 112A and 112B. The first and second connection pads 121P and 122P of tens to millions of the first and second semiconductor chips 121 and 122 having various functions through the connection structure 140 may be redistributed respectively. In addition, the connection structure 140 may be connected to the wiring structure 220, described later, to provide an electrical connection path between the semiconductor package 100A and the antenna substrate 200. The connection structure 140 may include an insulation layer 141, a redistribution layer 142 disposed on the insulation layer 141, and a connection via 143 passing through the insulation layer 141 and connected to the redistribution layer 142. The connection structure 140 may be designed with fewer or greater numbers of layers than that illustrated in the drawings.

As the material of the insulation layer 141, an insulating material may be used. In this case, in addition to the above-described insulating material, a photosensitive insulating material such as a PID resin may be used as the insulating material. For example, the insulation layer 141 may be a photosensitive insulation layer. When the insulation layer 141 has photosensitivity, the insulation layer 141 may be made thinner and the fine pitch of the connection vias 143 may be more easily achieved. The insulation layer 141 may be a photosensitive insulation layer containing an insulating resin and an inorganic filler. When the insulation layer 141 has multiple layers, these materials may be the same as each other, and may be different from each other, as needed. When the insulation layers 141 may be multilayered, since they are unified depending on a process, the boundaries may be unclear.

The redistribution layer 142 may serve to redistribute the connection pads 121P and 122P. As a material for forming the redistribution layer 142, a metal material such as copper (Cu), aluminum (Al), silver (Ag), tin (Sn), gold (Au), nickel (Ni), lead (Pb), titanium (Ti), or alloys thereof may be used. The redistribution layer 142 may also perform various functions, depending on a desired design of the layer. For example, a ground (GND) pattern, a power (PWR) pattern, a signal (S) pattern, and the like, may be included. In this case, the signal (S) pattern may include various signals except for a ground (GND) pattern, a power (PWR) pattern, and the like, for example, a data signal and the like. Also, via pads, electrical connection metal pads, or the like may be included. The redistribution layer 142 may include a feed pattern electrically connected to a feed line 223F.

The connection via 143 may electrically connect the redistribution layer 142, the first and second connection pads 121P and 122P, the first and second passive components 112A and 112B, and the like, formed on the different layers, to form an electrical path in the semiconductor package 100A. As a material for forming the connection via 143, a metal material such as copper (Cu), aluminum (Al), silver (Ag), tin (Sn), gold (Au), nickel (Ni), lead (Pb), titanium (Ti), or alloys thereof may be used. The connection via 143 may also be a field type via completely filled with a metal material, or a conformal type via in which a metal material is formed along a wall surface of a via hole. Also, a shape of the connection via 143 may be a tapered shape in a direction opposite to the backside wiring via 135. The connection via 143 may include a feed pattern electrically connected to the feed line 223F.

The first passivation layer 150 may protect the metal pattern layer 132 and the backside wiring layer 134 from external physical or chemical damage or the like. The first passivation layer 150 may include an insulating resin and an inorganic filler, but may not include glass fibers. For example, the first passivation layer 150 may be ABF, but is not limited thereto, and may also be a PID, a known solder resist (SR), or the like.

The second passivation layer 160 may protect the redistribution layer 142 of the connection structure 140 from external physical or chemical damage or the like. The second passivation layer 160 may include an insulating resin and an inorganic filler, but may not include glass fibers. For example, the second passivation layer 160 may be ABF, but is not limited thereto, and may also be a PID, a known solder resist (SR), or the like.

The first electrical connection metal 170 may physically and/or electrically connect the semiconductor package 100A and/or the antenna module 300A externally. For example, the semiconductor package 100A and/or the antenna module 300A may be mounted on the main board of the electronic device through the first electrical connection metal 170. The first electrical connection metal 170 may be formed of a material including a low melting point metal such as tin (Sn), more specifically, a solder, but is merely an example. The first electrical connection metal 170 may be a land, a ball, a pin, or the like. The first electrical connection metal 170 may be formed of multiple layers or a single layer. In a case of being formed of multiple layers, the substrate may include a copper pillar and a solder. In a case of a single layer, the substrate may include solder or copper, but this may be merely an example and is not limited thereto. The number, interval, arrangement type, etc., of the first electrical connection metal 170 are not particularly limited, and may be sufficiently modified, depending on a design specification by a skilled artisan. A surface treatment layer P of nickel (Ni)/gold (Au) or the like may be formed on a surface exposed from the first passivation layer 150 of the metal pattern layer 132 and/or the backside wiring layer 134, connected to the first electrical connection metal 170, as necessary.

At least one of the first electrical connection metal 170 may be disposed in a fan-out area. The fan-out area refers to an area, except for those in which the first and second semiconductor chips 121 and 122 are disposed. The fan-out package may be more reliable than the fan-in package, may have many I/O terminals, and may facilitate 3D interconnection. In addition, a package thinner than a ball grid array (BGA) package, a land grid array (LGA) package, and the like, may be manufactured, and may be excellent in price competitiveness. For example, the semiconductor package 100A may be a fan-out semiconductor package 100A.

The second electrical connection metal 180 may connect the semiconductor package 100A and the antenna substrate 200 to provide a composite module 300A. The electrical connection path of the antenna module 300A may be provided through the second electrical connection metal 180. The second electrical connection metal 180 may also be formed of a material including a low melting point metal such as tin (Sn), more specifically, solder or the like, but this may be merely an example and the material may be not particularly limited thereto. The second electrical connection metal 180 may also be a land, a ball, a pin, or the like, and may be formed of multiple layers or a single layer. Also, the number, spacing, arrangement form, etc. of the second electrical connection metal 180 are not particularly limited, and may be sufficiently modified according to design specifications for a person skilled in the art.

Next, as described above, the antenna substrate 200 may include the antenna structure 210 and the wiring structure 220. The antenna substrate 200 may further include a first cover layer 230 disposed in an upper portion of the antenna structure 210 and covering the first wiring layer 212a, and a second cover layer 250 disposed in a lower portion of the wiring structure 220 and covering the wiring layer 222. The antenna structure 210 may be thicker than the wiring structure 220. The wiring structure 220 and the connection structure 140 may be physically contacted to each other, for example, be integrated, without being electrically connected to each other. The antenna substrate 200 may have an asymmetric structure with respect to the antenna structure 210.

The antenna structure 210 may be a region capable of realizing an mmWave/5G antenna, and may include the dielectric layer 211, the first pattern layer 212a formed on the upper surface of the dielectric layer 211, the second pattern layer 212b formed on the lower surface of the dielectric layer 211, and the conductor via layer 213 passing through the dielectric layer 211 and electrically connecting the first and second pattern layers 212a and 212b to each other. In the antenna structure 210, the first pattern layer 212a may include the antenna pattern 212aA, the second pattern layer 212b may include the ground pattern 212bG, and the dielectric layer 211 may be disposed therebetween. Therefore, since a distance between the antenna and the ground plane may be stably secured within an antenna module irrespective of changes in the external environment, the radiation characteristic of the antenna may be maintained. Also, since a size of the antenna may be miniaturized to reduce structure of the entire module, by appropriately using the dielectric constant (Dk) of the dielectric layer 211, the spatial efficiency may increase and the cost may decrease. For example, the dielectric constant (Dk) of the dielectric layer 211 of the antenna structure 210 may be higher than the dielectric constant (Dk) of the core layer 111-1 of the frame 111. The dielectric constant (Dk) of the dielectric layer 211 of the antenna structure 210 may have a higher dielectric constant (Dk) with respect to other insulation layers or dielectric layers in the module 300A.

As the material of the dielectric layer 211, an insulating material may be used. As the insulating material, a thermosetting resin such as an epoxy resin, a thermoplastic resin such as polyimide, or a material containing a reinforcing material such as a glass fiber and/or an inorganic filler, for example, prepreg, ABF, FR-4, BT, or the like may be used. For example, as the material of the dielectric layer 211, conventional copper clad laminate (CCL) of Low Df & Low Dk, or glass-based or ceramic-based insulating material of Low Df & High Dk may be applied, depending on required material properties. Alternatively, a liquid crystal polymer (LCP) may also be used, and may form an antenna capable of downsizing, as compared with the case of using the glass-based or ceramic-based insulating material of Low Df & High Dk as the material of the dielectric layer 211. In the case of using the LCP, it is possible to form an antenna having higher performance in spite of miniaturization. The thickness of the dielectric layer 211 may be freely changed, depending on the impedance matching characteristic.

The first wiring layer 212a may include the antenna pattern 212aA that realizes an mmWave/5G antenna or the like, and may include other ground patterns 212aG and the like. The antenna pattern 212aA may be a dipole antenna, a patch antenna, or the like. A periphery portion of the antenna pattern 212aA may be surrounded by a ground pattern, but is not limited thereto. As a material for forming the first wiring layer 212a, a metal material such as copper (Cu), aluminum (Al), silver (Ag), tin (Sn), gold (Au), nickel (Ni), lead (Pb), titanium (Ti), or alloys thereof may be used. The second wiring layer 212b may include a ground pattern 212bG for the antenna pattern 212aA, and may include other signal patterns and the like. The ground pattern 212bG may be in the form of a ground plane. As a material for forming the second wiring layer 212b, a metal material such as copper (Cu), aluminum (Al), silver (Ag), tin (Sn), gold (Au), nickel (Ni), lead (Pb), titanium (Ti), or alloys thereof may be used.

The conductor via layer 213 may electrically connect the first and second pattern layers 212a and 212b formed on different layers, thereby providing an electrical path within the antenna structure 210. The conductor via layer 213 may include the feed line via 213F, and may include other ground via 213G, and the like. The feed line via 213F may be electrically connected to the antenna pattern 212aA. The ground via 213G may densely surround the feed line via 213F. As a material for forming the conductor via layer 213, a metal material such as copper (Cu), aluminum (Al), silver (Ag), tin (Sn), gold (Au), nickel (Ni), lead (Pb), titanium (Ti), or alloys thereof may be used. The conductor via layer 213 may be be a field type via completely filled with a metal material, or a conformal type via in which a metal material is formed along a wall surface of a via hole, in a different manner to those illustrated in the drawings. Further, any known vertical cross-sectional shape such as an hourglass shape or a cylindrical shape may be applied.

The wiring structure 220 may include an insulation layer 221, a wiring layer 222 formed on the insulation layer 221, and a wiring via 223 passing through the insulation layer 221 and electrically connecting the wiring layers 222 formed in different layers, or electrically connected to a pattern layer or a redistribution layer having a different member. The wiring structure 220 may have a relatively large number of wiring layers, or may have only one wiring layer.

As the material of the insulation layer 221, an insulating material may be used. As the insulating material, ABF, PID, or the like may be used. When the insulation layer 221 is provided in plurality, the boundaries of the respective layers may be unclear, but are not limited thereto. The wiring layer 222 may include the feed pattern 222F electrically connected to the feed line via 213F, and may include other ground pattern 222G and the like. As the material for forming the wiring layer 222, a metal material such as copper (Cu), aluminum (Al), silver (Ag), tin (Sn), gold (Au), nickel (Ni), lead (Pb), titanium (Ti), or alloys thereof may be used. The wiring via 223 may electrically connect the wiring layers 222 formed on different layers or electrically connect the wiring layers 222 to pattern layers or redistribution layers having other members, to provide an electrical path. The wiring via 223 may include a feed line 223F electrically connected to a feed pattern 222F. As a material for forming the wiring via 223, a metal material such as copper (Cu), aluminum (Al), silver (Ag), tin (Sn), gold (Au), nickel (Ni), lead (Pb), titanium (Ti), or alloys thereof may be used.

The first and second cover layers 230 and 250 may protect the antenna structure 210 and the wiring structure 220 from external physical or chemical damage or the like, respectively. The first and second cover layers 230 and 250 may include an insulating resin and an inorganic filler, respectively, but may not include glass fiber. For example, the first and second cover layers 230 and 250 may be ABF, but is not limited thereto, and may also be a PID, a solder resist (SR), or the like.

Figure 12:
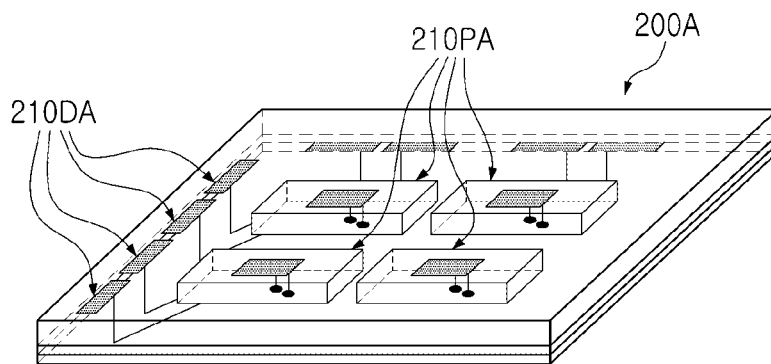
FIG. 12 is a schematic perspective view illustrating an example of an antenna substrate applied to the antenna module of FIG. 9.

FIG. 12 is a schematic perspective view illustrating an example of an antenna substrate applied to the antenna module of FIG. 9.

Figure 13:
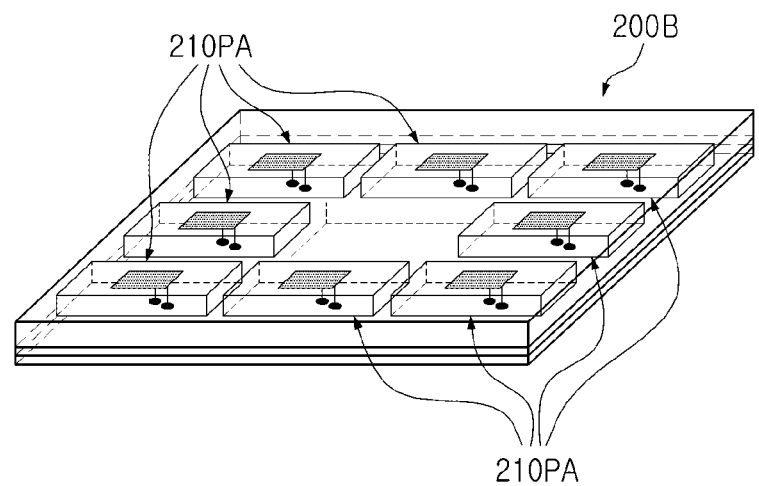
FIG. 13 is a schematic perspective view illustrating another example of an antenna substrate applied to the antenna module of FIG. 9.

FIG. 13 is a schematic perspective view illustrating another example of an antenna substrate applied to the antenna module of FIG. 9.

Referring to the drawings, an antenna substrate 200A may be configured to include a plurality of dipole antennas 210DA and a plurality of patch antennas 210PA. Alternatively, an antenna substrate 200B may also be configured to include a relatively large number of patch antennas 210PA. For example, the antenna substrates 200A and 200B may include various types of antennas, depending on a design.

Figure 14:
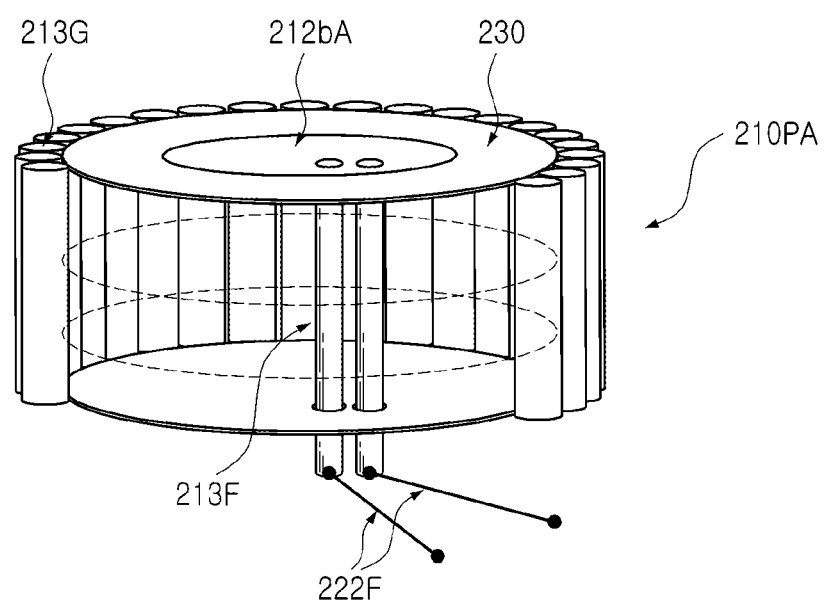
FIG. 14 is a schematic perspective view illustrating an example of a patch antenna of an antenna substrate applied to the antenna module of FIG. 9.

FIG. 14 is a schematic perspective view illustrating an example of a patch antenna of an antenna substrate applied to the antenna module of FIG. 9.

Referring to the drawings, a patch antenna 210PA may have a shape surrounded by a ground via 213G in which an antenna pattern 212bA and a feed line via 213F are densely formed. An insulating material such as a first cover layer 230 may be disposed between the antenna pattern 212bA and the ground via 213G. The feed line via 213F may be electrically connected to a feed pattern 222F, and, consequently, may be electrically connected to connection pads 121P and 122P.

Figure 15:
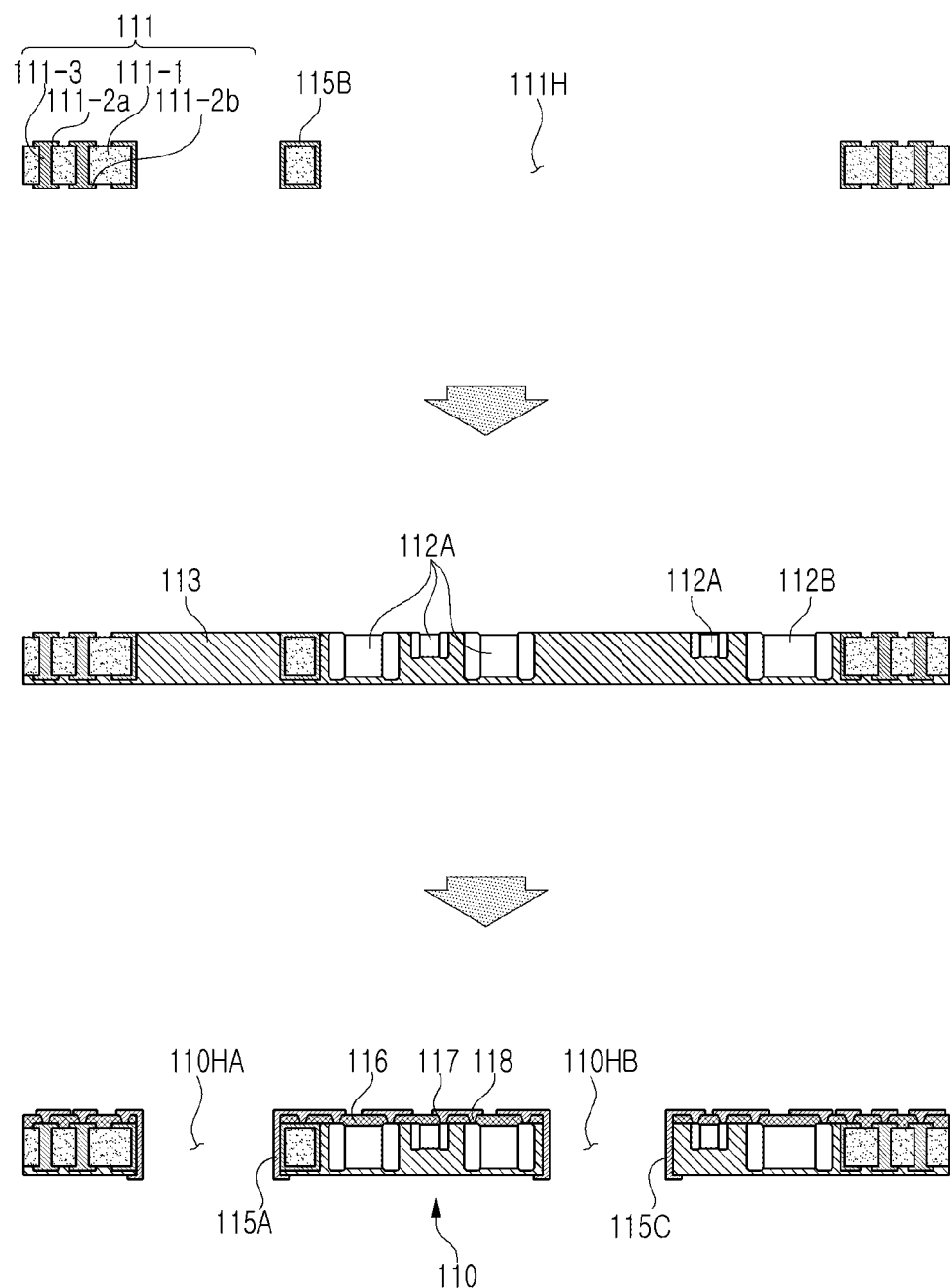
FIGS. 15 and 16 are schematic process diagrams illustrating an example of manufacturing a semiconductor package applied to the antenna module of FIG. 9.
Figure 16:
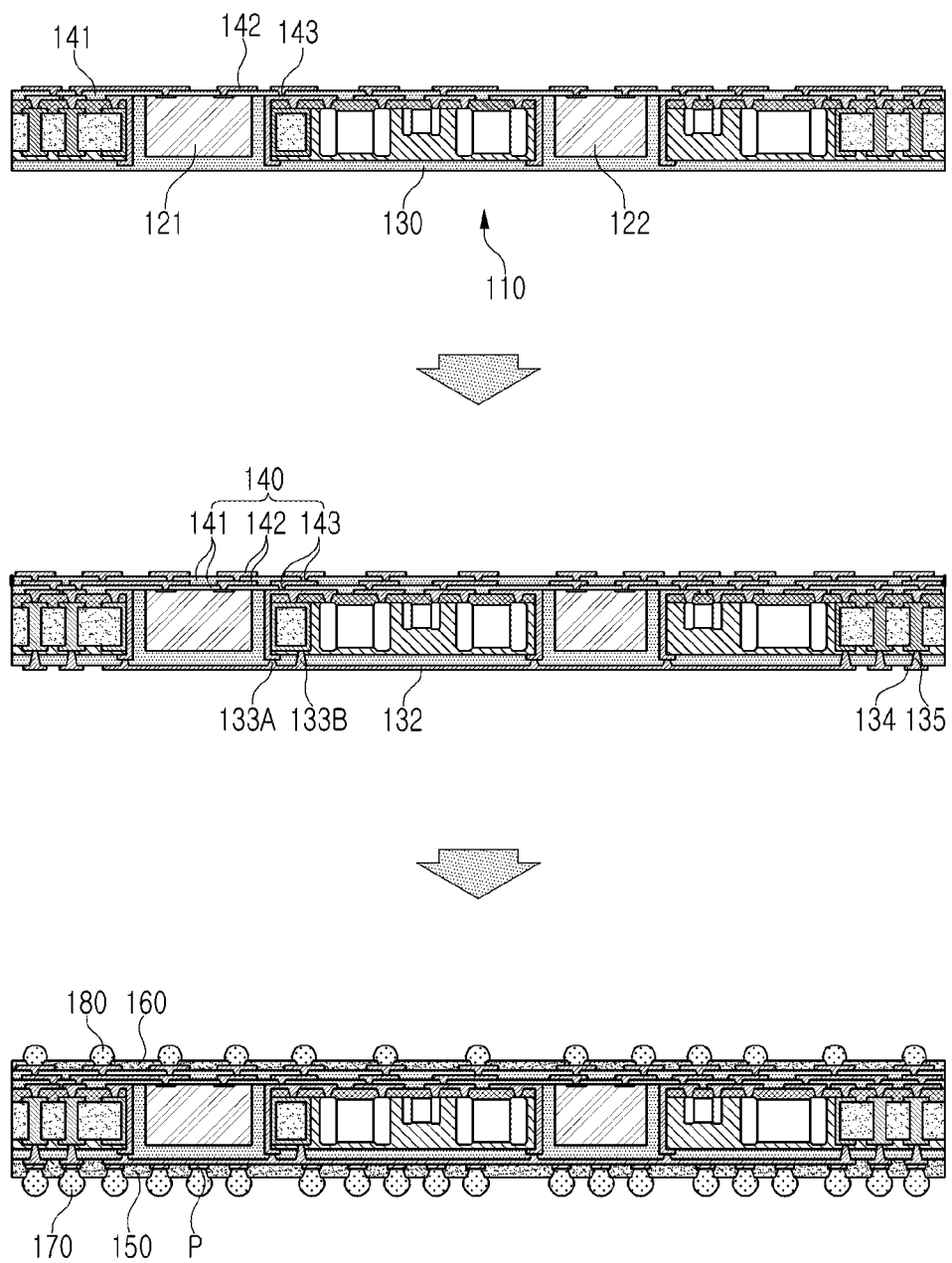

FIGS. 15 and 16 are schematic process diagrams illustrating an example of manufacturing a semiconductor package applied to the antenna module of FIG. 9.

Referring to FIG. 15, first, a frame 111 may be prepared. For example, a core layer 111-1 may be prepared by a copper-clad laminate and the like, and core wiring layers 111-2a and 111-2b and a core wiring via layer 111-3 may be formed in the core layer 111-1 by a plating process. Further, an opening 111H may be formed in the core layer 111-1 by a laser drilling process or the like, and a second metal layer 115B may be formed by a plating process. According to the above, the frame 111 in which the second metal layer 115B is formed may be prepared. Portions of the second metal layer 115B formed on the inner walls of the opening 111H and the first through-hole 110H may have the same thickness, of have substantially the same thickness in consideration of a variation in a process. Next, first and second passive components 112A and 112B may be disposed in the opening 111H by using a tape or the like, and the frame 111, and the first and second passive components 112A and 112B may be encapsulated by a first encapsulant 113. Next, an insulation layer 116, a wiring layer 117, and a wiring via 118 may be formed. Then, first and second through-holes 110HA and 110HB passing through the insulation layer 116 and the first encapsulant 113 may be formed by using a laser drill or the like, and first and third metal layers 115A and 115C may be formed by a plating process. Because the first and third metal layers 115A and 115C may be formed by the same process with the same material, thicknesses of the first and third metal layers 115A and 115C may be the same, or substantially the same in consideration of a variation in the process. Finally, a core structure 110 may be manufactured by the series of processes.

Referring to FIG. 16, first and second semiconductor chips 121 and 122 may be disposed on the first and second through-holes 110HA and 110HB by using a tape or the like. The core structure 110 and the first and second semiconductor chips 121 and 122 may be encapsulated by a second encapsulant 130. A copper foil (not illustrated) may be formed on the second encapsulant 130. Thereafter, an insulation layer 141, a redistribution layer 142, and a connection via 143 may be partially formed. Next, a metal pattern layer 132 and a backside wiring layer 134 may be formed on the second encapsulant 130 by a plating process using a copper foil (not illustrated) as a seed layer. Portions of the seed layer and a plating layer may constitute the metal pattern layer 132, and other portions of the seed layer and the plating layer may constitute the backside wiring layer 134. Also, first to third metal vias 133A, 133B, and 133C and a backside wiring via 135 may be formed by a plating process. In this case, an insulation layer 141, a redistribution layer 142, and a connection via 143 may be additionally formed, and as a result, a connection structure 140 may be formed. Next, first and second passivation layers 150 and 160 may be stacked, respectively, and as necessary, a surface treatment layer P may be formed. Thereafter, first and second electrical connection metals 170 and 180 may be formed, respectively. Finally, the semiconductor package 100A according to the above-described example may be manufactured.

Since other configurations may be substantially the same as those described with reference to FIGS. 9 to 14, a detailed description thereof will be omitted.

Figure 17:
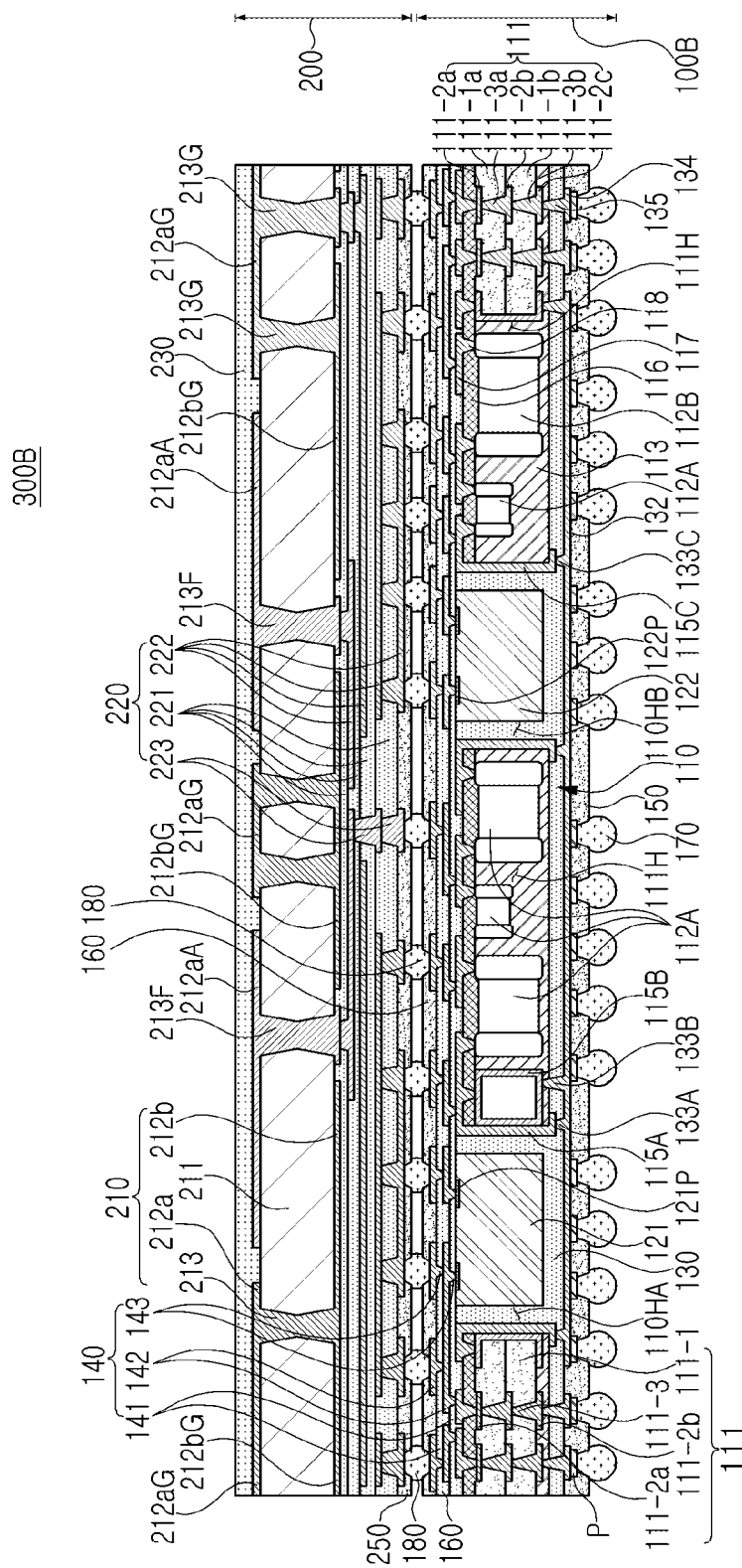
FIG. 17 is a schematic cross-sectional view illustrating another example of an antenna module.

FIG. 17 is a schematic cross-sectional view illustrating another example of an antenna module.

An antenna module 300B according to another example may include a first build-up layer 111-1a in which a frame 111 of a semiconductor package 100B is in contact with a connection structure 140; a first build-up wiring layer 111-2a in contact with the connection structure 140 and embedded in the first build-up layer 111-1a; a second build-up wiring layer 111-2b disposed on a surface of the first build-up layer 111-1a, opposite to a surface in which the first build-up wiring layer 111-2a is embedded; a second build-up layer 111-1b disposed on the first build-up layer 111-1a and covering the second build-up wiring layer 111-2b; and a third build-up wiring layer 111-2c disposed on the second build-up layer 111-1b. The first to third build-up wiring layers 111-2a, 111-2b, and 111-2c may be electrically connected to first and second connection pads 121P and 122P. The first and second build-up wiring layers 111-2a and 111-2b, and the second and third build-up wiring layers 111-2b and 111-2c may be connected to each other through first and second build-up wiring via layers 111-3a and 111-3b passing through the first and second build-up layers 111-1a and 111-1b, respectively. As such, when the frame 111 includes a relatively large number of the wiring layers 111-2a, 111-2b, and 111-2c, design of the connection structure 140 may be further simplified. Therefore, the yield problem of the first and second semiconductor chips 121 and 122, occurring during the formation of the connection structure 140, may be improved.

At least one of the first to third build-up wiring layers 111-2a, 111-2b, and 111-2c may include a filter pattern (not illustrated) electrically connected to an antenna pattern 212aA. In this case, as an insulation material of an antenna structure 210, a material having high dielectric constant may be used for miniaturization of an antenna, and as an insulation material of the frame 111, a material having low dielectric constant may be used for reduction in filter loss, but are not limited thereto.

When the first build-up wiring layer 111-2a is embedded in the first build-up layer 111-1a, since a step difference generated by a thickness of the first build-up wiring layer 111-2a may be minimized, a distance for insulating the connection structure 140 may be constant. For example, a difference between a distance from a redistribution layer 142 of the connection structure 140 to an upper surface of the first build-up layer 111-1a, and a distance from a redistribution layer 142 of the connection structure 140 to the first and second connection pads 121P and 122P may be smaller than a thickness of the first build-up wiring layer 111-2a. Therefore, a high-density wiring design of the connection structure 140 may be easily performed.

A distance between the first build-up wiring layer 111-2a of the frame 111 and the redistribution layer 142 of the connection structure 140 may be longer than a distance between the redistribution layer 142 of the connection structure 140 and the first and second connection pads 121P and 122P. This may be because the first build-up wiring layer 111-2a may be recessed into the first build-up layer 111-1a. As above, when the first build-up wiring layer 111-2a is recessed into the first build-up layer 111-1a to have a step difference between an upper surface of the first build-up layer 111-1a and an upper surface of the first build-up wiring layer 111-2a, a material for forming an encapsulant 130 may be prevented from bleeding to contaminate the first build-up wiring layer 111-2a. The second build-up wiring layer 111-2b of the frame 111 may be positioned between an active surface and an inactive surface of the first and second semiconductor chips 121 and 122, respectively. Since the frame 111 may have considerable thickness, the second build-up wiring layer 111-2b formed inside the frame 111 may be disposed on a level between the active surface and the inactive surface of the first and second semiconductor chips 121 and 122, respectively.

Although not specifically illustrated in the drawing, the thickness of each of the first to third build-up wiring layers 111-2a, 111-2b, and 111-2c of the frame 111 may be thicker than the redistribution layer 142 of the connection structure 140. Since the frame 111 may have a considerable thickness, and the first to third build-up wiring layers 111-2a, 111-2b, and 111-2c may be formed to have a relatively large size, depending on scale. The redistribution layer 142 of the connection structure 140 may be formed in a relatively small size than the first to third build-up wiring layers 111-2a, 111-2b, and 111-2c for fine circuit design.

The materials of the first and second build-up layers 111-1a and 111-1b are not particularly limited. For example, an insulating material may be used. As the insulating material, a thermosetting resin such as an epoxy resin, a thermoplastic resin such as polyimide, or a mixture of these resins with an inorganic filler, or a material impregnated with a core material such as glass fiber, for example, prepreg, ABF, FR-4, BT, and the like may be used. As necessary, a photoimagable dielectric (PID) resin may be used.

The first to third build-up wiring layers 111-2a, 111-2b, and 111-2c may perform a function of redistributing the first and second connection pads 121P and 122P of the first and second semiconductor chips 121 and 122, and the frame 111 may perform a function of a connection structure. As the material for forming the first to third build-up wiring layers 111-2a, 111-2b, and 111-2c, a metal material such as copper (Cu), aluminum (Al), silver (Ag), tin (Sn), gold (Au), nickel (Ni), lead (Pb), titanium (Ti), or alloys thereof may be used. The first to third build-up wiring layers 111-2a, 111-2b, and 111-2c may also perform various functions, depending on a desired design of the layer. For example, a ground (GND) pattern, a power (PWR) pattern, a signal (S) pattern, and the like, may be included. In this case, the signal (S) pattern may include various signals except for a ground (GND) pattern, a power (PWR) pattern, and the like, for example, a data signal and the like. Also, signal via pads, ground via pads, or the like may be included.

The first and second build-up wiring via layers 111-3a and 111-3b may electrically connect the first to third build-up wiring layers 111-2a, 111-2b, and 111-2c formed on different layers, thereby forming an electrical path in the frame 111. The first and second build-up wiring via layers 111-3a and 111-3b may also be formed of a metal material. The first and second build-up wiring via layers 111-3a and 111-3b may be a field type completely filled with a metal material, respectively, or a metal material may be a conformal type via formed along a wall surface of a via hole. Further, they may each have a tapered shape. A portion of the pads of the first build-up wiring layer 111-2a may serve as stoppers, when a hole for the first build-up wiring via layer 111-3a is formed. The build-up wiring via layer 111-3a may be advantageous in terms of a tapered shape in which a width of a lower surface thereof is wider than a width of an upper surface thereof. In this case, the first build-up wiring via layer 111-3a may be integrated with a pad pattern of the second build-up wiring layer 111-2b. In addition, when a hole for the second build-up wiring via layer 111-3b is formed, a portion of the pads of the second build-up wiring layer 111-2b may serve as stoppers. It may be advantageous in terms of the process that the second build-up wiring via layer 111-3b has a tapered shape in which a width of a lower surface thereof is wider than a width of an upper surface thereof. In this case, the second build-up wiring via layer 111-3b may be integrated with the pad pattern of the third build-up wiring layer 111-2c.

Since other configurations may be substantially the same as those described with reference to FIGS. 9 to 16, a detailed description thereof will be omitted.

Figure 18:
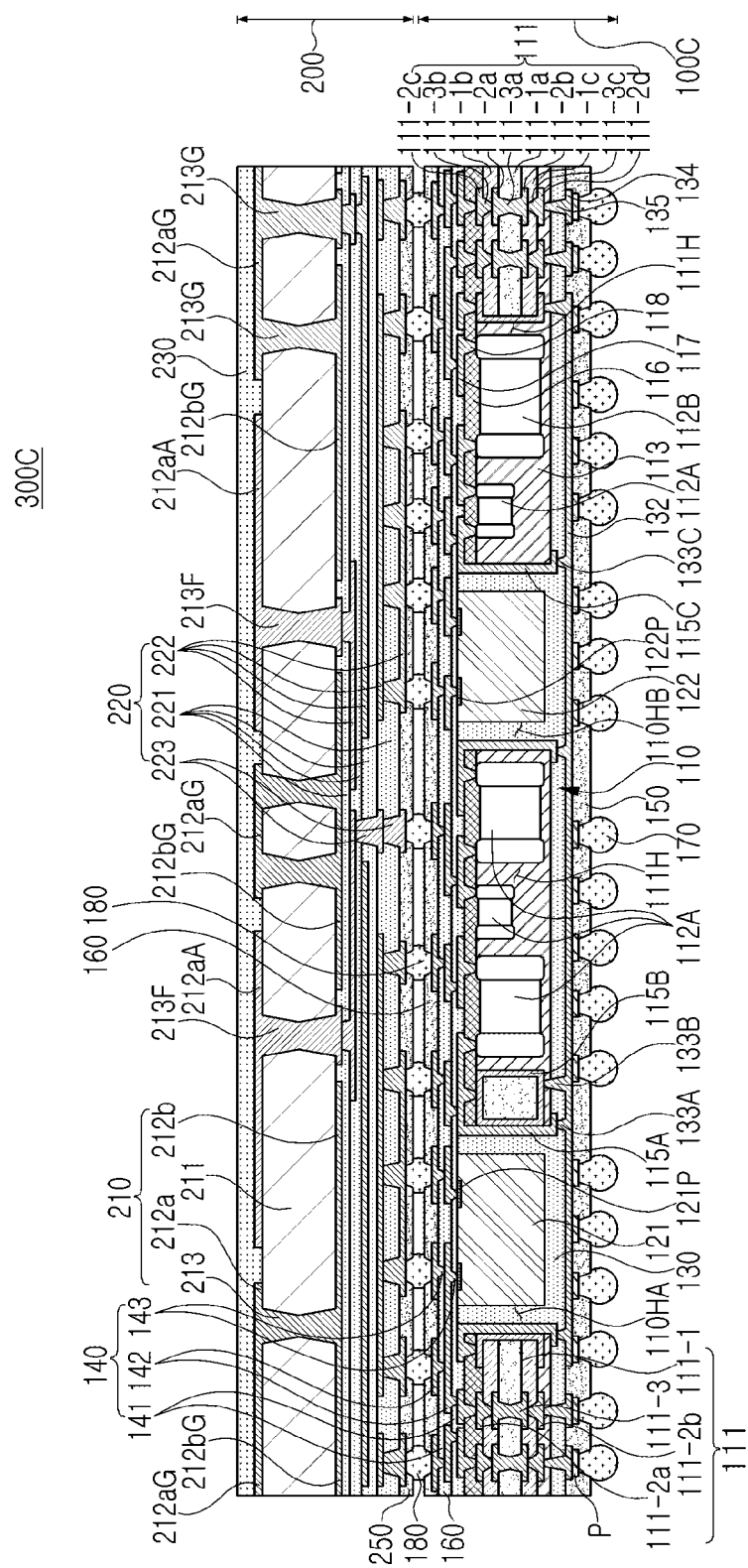
FIG. 18 is a schematic cross-sectional view illustrating another example of an antenna module.

FIG. 18 is a schematic cross-sectional view illustrating another example of an antenna module.

Referring to the drawings, in an antenna module 300C according to another example, a frame 111 of a semiconductor package 100C may include a core layer 111-1a, a first core wiring layer 111-2a and a second core wiring layer 111-2b disposed on both surfaces of the core layer 111-1a, a first build-up layer 111-1b disposed on the first core wiring layer 111-2a and covering the first core wiring layer 111-2a, a first build-up wiring layer 111-2c disposed on the first build-up layer 111-1b, a second build-up layer 111-1c disposed on the core layer 111-1a and covering the second core wiring layer 111-2b, and a second build-up wiring layer 111-2d disposed on the second build-up layer 111-1c. The first and second core wiring layers 111-2a and 111-2b, and the first and second build-up wiring layers 111-2c and 111-2d may be electrically connected to first and second connection pads 121P and 122P. Since the frame 111 may include a relatively large number of wiring layers 111-2a, 111-2b, 111-2c, and 111-2d, a connection structure 140 may be further simplified. The first and second core wiring layers 111-2a and 111-2b, and the first and second build-up wiring layers 111-2c and 111-2d may be electrically connected to each other, through a core wiring via layer 111-3a, and first and second build-up wiring via layers 111-3b and 111-3c passing through the core layer 111-1a and the first and second build-up layers 111-1b and 111-1c, respectively.

At least one of the first and second core wiring layers 111-2a and 111-2b, and the first and second build-up wiring layers 111-2c and 111-2d may include a filter pattern (not illustrated) electrically connected to an antenna pattern 212aA. In this case, as an insulation material of an antenna structure 210, a material having high dielectric constant may be used for miniaturization of an antenna, and as an insulation material of the frame 111, a material having low dielectric constant may be used for reduction in filter loss, but are not limited thereto.

The core layer 111-1a may be thicker than the first build-up layer 111-1b and the second build-up layer 111-1c. The core layer 111-1a may be relatively thick to maintain rigidity basically. The first build-up layer 111-1b and the second build-up layer 111-1c may be provided to forma relatively large number of the first and second build-up wiring layers 111-2c and 111-2d. In a similar manner, an average diameter of the core wiring via layer 111-3a passing through the core layer 111-1a may be greater than those of the build-up wiring via layers 111-3b and 111-3c passing through the first and second build-up layers 111-1b and 111-1c.

Although not illustrated in the drawing, a thickness of each of the first and second core wiring layers 111-2a and 111-2b, and the first and second build-up wiring layers 111-2c and 111-2d may be thicker than a thickness of each of redistribution layers 142 of a connection structure 140. Since the frame 111 may have a considerable thickness, the first and second core wiring layers 111-2a and 111-2b, and the first and second build-up wiring layers 111-2c and 111-2d may also be formed in a relatively large size. The redistribution layers 142 of the connection structure 140 may be formed in a relatively small size for fine circuit design.

Since other configurations may be substantially the same as those described with reference to FIGS. 9 to 17, a detailed description thereof will be omitted.

Figure 19:
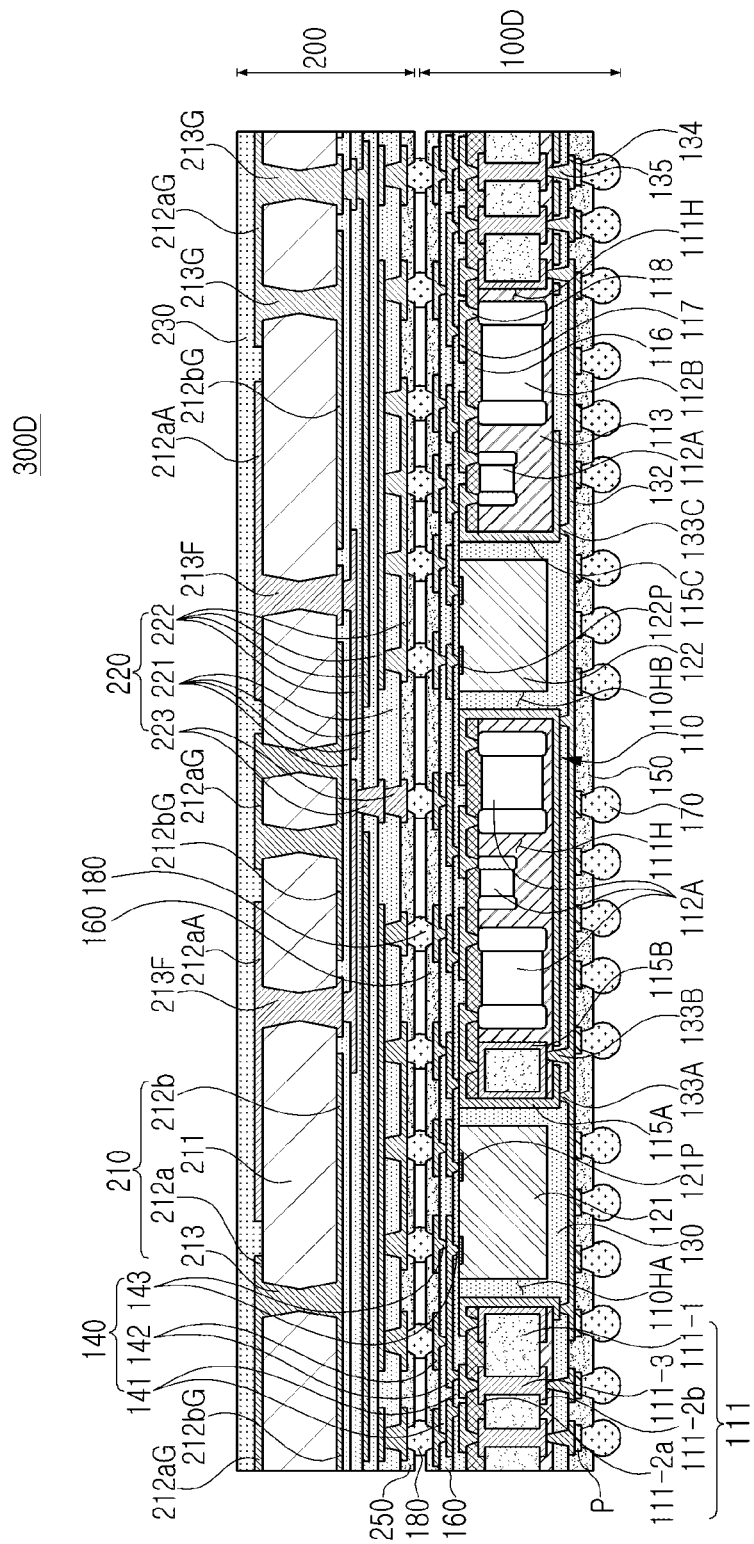
FIG. 19 is a schematic cross-sectional view illustrating another example of an antenna module.

FIG. 19 is a schematic cross-sectional view illustrating another example of an antenna module.

Referring to the drawings, in an antenna module 300D according to another example, first and third metal layers 115A and 115C of a semiconductor package 100D may selectively extend on a first encapsulant 113 to cover a region directly above a first passive component 112A, not to cover a region directly above a second passive component 112B. At least one of first and third metal vias 133A and 133C may connect the first and third metal layers 115A and 115C to a metal pattern layer 132 in the region directly above the first passive component 112A. The first passive component 112A may be a capacitor, and the second passive component 112B may be an inductor. For example, the region directly above the first passive component 112A, which may be particularly required to generate heat, may be selectively covered with a metal material, and may effectively dissipate the heat through the metal vias. In the case of the second passive component 112B which needs to be spaced apart from the metal material, the region directly above may be not covered with the metal material. As necessary, the first and third metal layers 115A and 115C may be connected to each other and may be integrated on the first encapsulant 113.

Since other configurations may be substantially the same as those described with reference to FIGS. 9 to 18, a detailed description thereof will be omitted. The semiconductor package 100D of the antenna module 300D described in FIG. 19 may be combined with the semiconductor packages 100B and 100C of the antenna modules 300B and 300C described in FIGS. 17 and 18.

Figure 20:
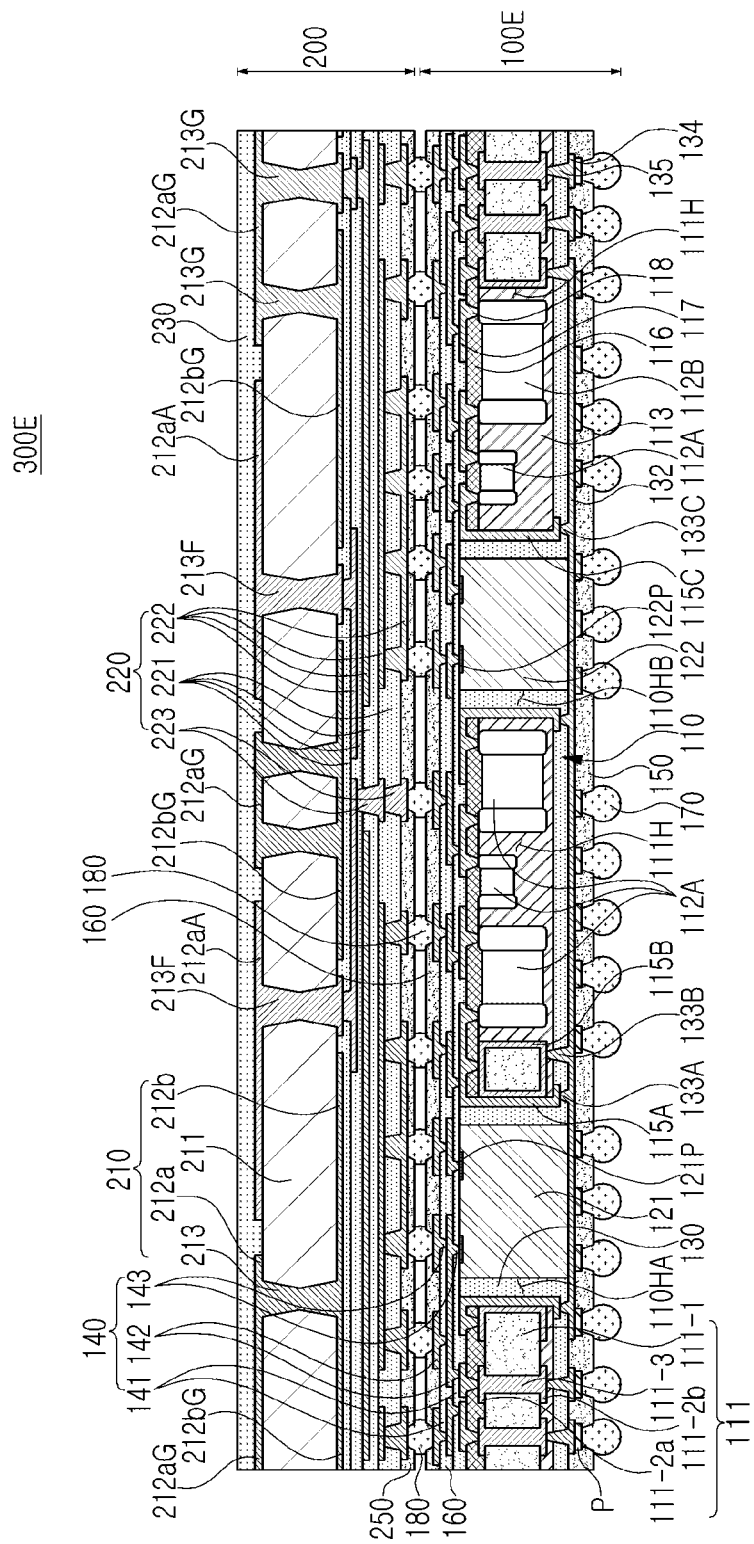
FIG. 20 is a schematic cross-sectional view illustrating another example of an antenna module.

FIG. 20 is a schematic cross-sectional view illustrating another example of an antenna module.

Referring to the drawings, in an antenna module 300E according to another example, first and second inactive surfaces of first and second semiconductor chips 121 and 122 of a semiconductor package 100E may be physically connected to a metal pattern layer 132, and may be coplanar with a surface of a second encapsulant 130 in contact with the metal pattern layer 132. In this case, heat generated from the first and second semiconductor chips 121 and 122 may be more effectively dissipated through the metal pattern layer 132. For example, since an area of a thermal path may be widened and the heat may be dissipated directly, the heat dissipation effect may be further improved.

Since other configurations may be substantially the same as those described with reference to FIGS. 9 to 19, a detailed description thereof will be omitted.

Figure 21:
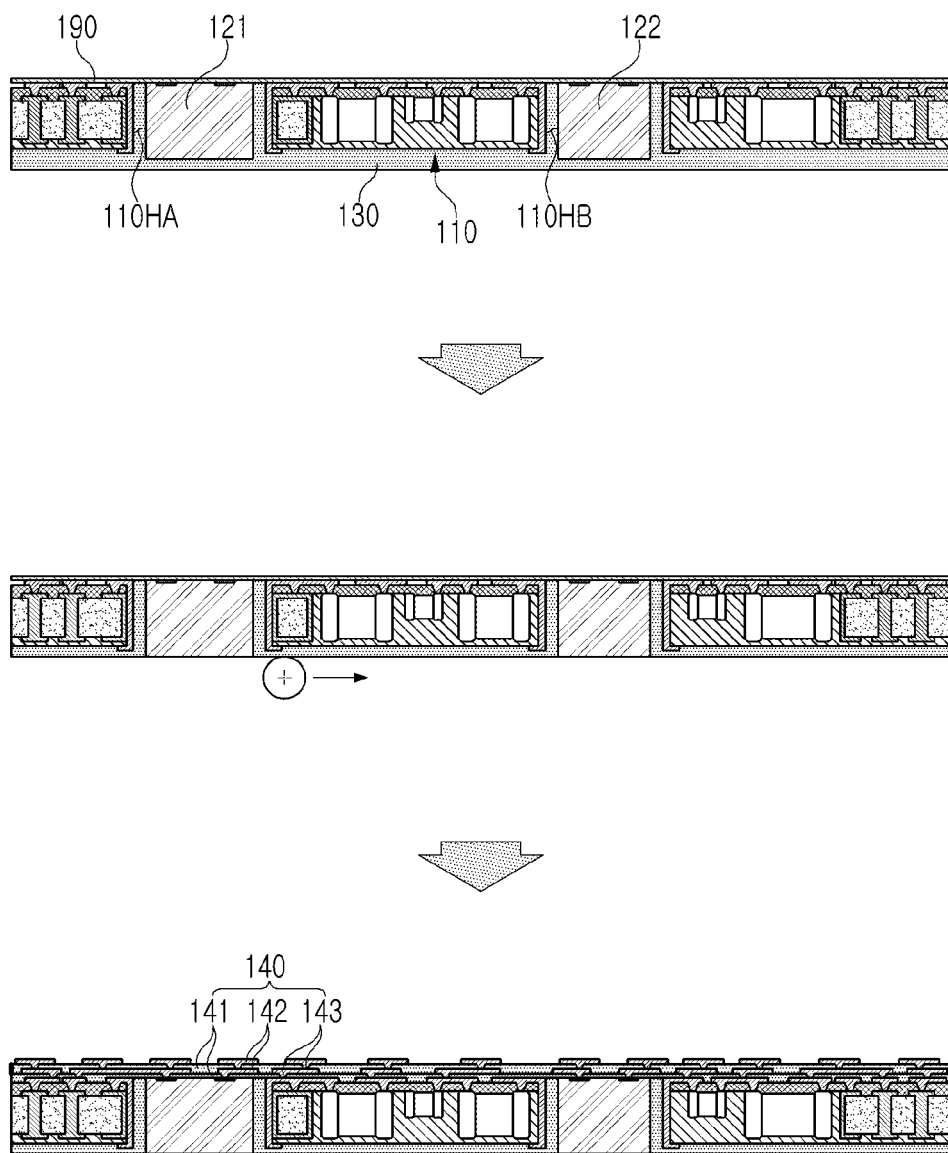
FIGS. 21 and 22 are schematic process diagrams illustrating an example of manufacturing a semiconductor package applied to the antenna module of FIG. 20.
Figure 22:
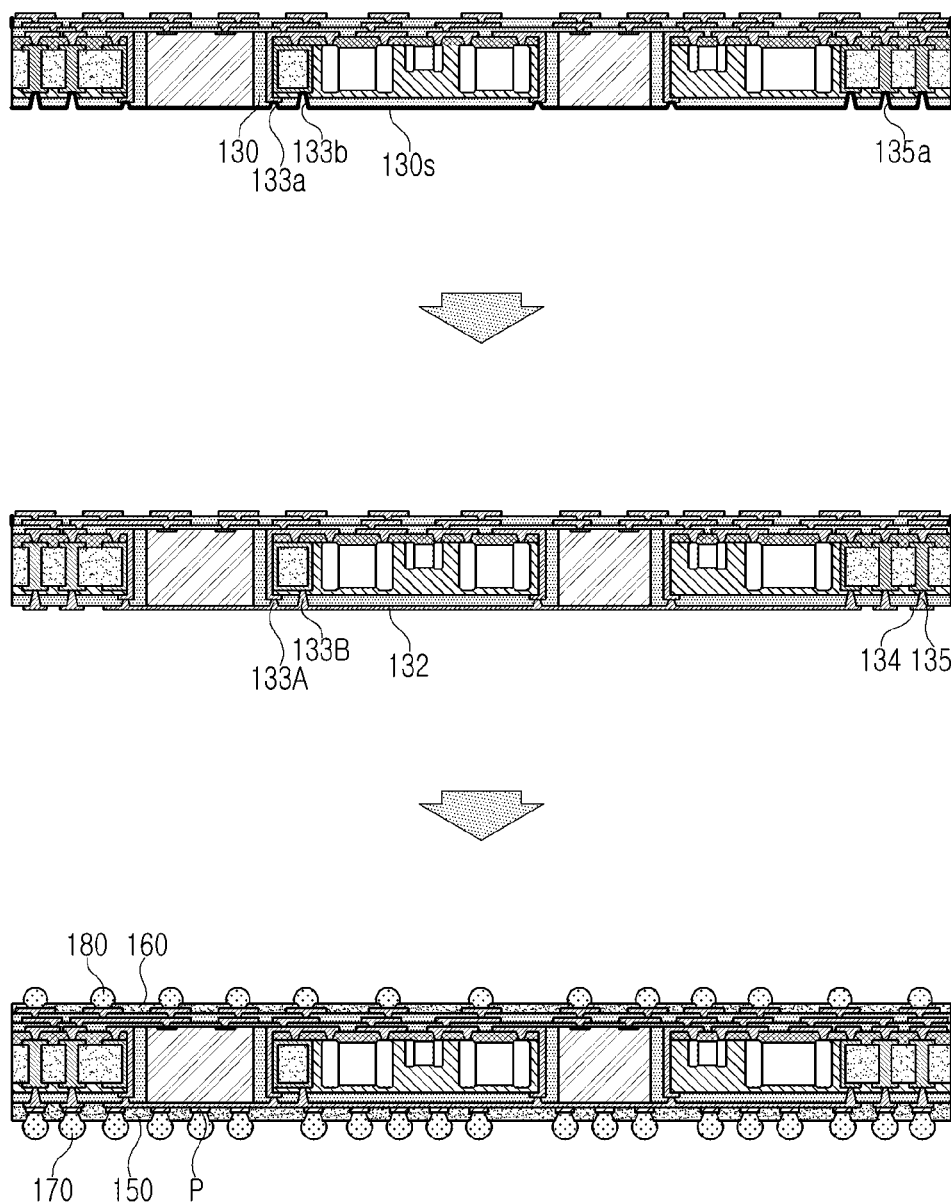

FIGS. 21 and 22 are schematic process diagrams illustrating an example of manufacturing a semiconductor package applied to the antenna module of FIG. 20.

Referring to FIG. 21, first, a core structure 110 having first and second through-holes 110HA and 110HB may be formed as described above, first and second semiconductor chips 121 and 122 may be respectively disposed in the first and second through-holes 110HA and 110HB using a tape 190, and the core structure 110 and the first and second semiconductor chips 121 and 122 may be encapsulated with a second encapsulant 130. Next, the second encapsulant 130 may be subjected to a grinding process such that first and second inactive surfaces of the first and second semiconductor chips 121 and 122 are exposed by a grinding process. Next, the tape 190 may be removed, and an insulation layer 141, a redistribution layer 142, and a connection via 143 may be formed, as desired, to form a connection structure 140.

Referring to FIG. 22, on the second encapsulant 130, via holes 133a, 133b, and 135a may be formed, and a seed layer 130s may be formed. Next, a metal pattern layer 132 and a backside wiring layer 134 may be formed by a plating process using the seed layer 130s. Also, first and second metal vias 133A and 133B and a backside wiring via 135 may be formed by a plating process. Next, first and second passivation layers 150 and 160 may be stacked, and as necessary, a surface treatment layer P may be formed. Then, after first and second electrical connection metals 170 and 180 are respectively formed, a semiconductor package 100E according to another example described above may be manufactured.

Since other configurations may be substantially the same as those described with reference to FIGS. 9 to 20, a detailed description thereof will be omitted.

Figure 23:
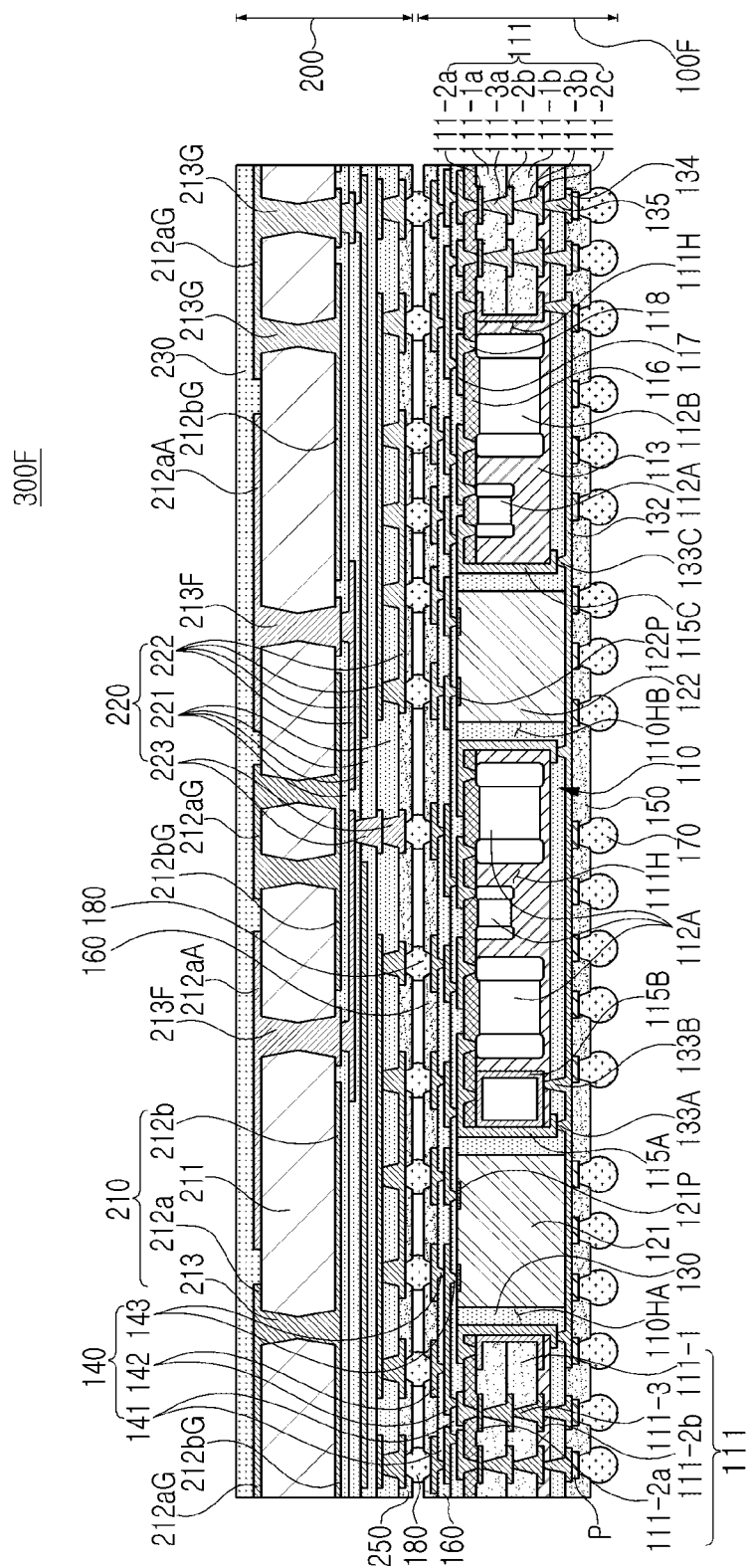
FIG. 23 is a schematic cross-sectional view illustrating another example of an antenna module.

FIG. 23 is a schematic cross-sectional view illustrating another example of an antenna module.

Referring to the drawings, an antenna module 300F according to another example may include a first build-up layer 111-1a in which a frame 111 of a semiconductor package 100F is in contact with a connection structure 140; a first build-up wiring layer 111-2a in contact with the connection structure 140 and embedded in the first build-up layer 111-1a; a second build-up wiring layer 111-2b disposed on a surface of the first build-up layer 111-1a, opposite to a surface in which the first build-up wiring layer 111-2a is embedded; a second build-up layer 111-1b disposed on the first build-up layer 111-1a and covering the second build-up wiring layer 111-2b; and a third build-up wiring layer 111-2c disposed on the second build-up layer 111-1b. The first to third build-up wiring layers 111-2a, 111-2b, and 111-2c may be electrically connected to first and second connection pads 121P and 122P. The first and second build-up wiring layers 111-2a and 111-2b, and the second and third build-up wiring layers 111-2b and 111-2c may be connected to each other through first and second build-up wiring via layers 111-3a and 111-3b passing through the first and second build-up layers 111-1a and 111-1b, respectively. First and second inactive surfaces of first and second semiconductor chips 121 and 122 may be physically connected to a metal pattern layer 132, and may be coplanar with a surface of a second encapsulant 130 in contact with the metal pattern layer 132.

Since other configurations may be substantially the same as those described with reference to FIGS. 9 to 22, a detailed description thereof will be omitted.

Figure 24:
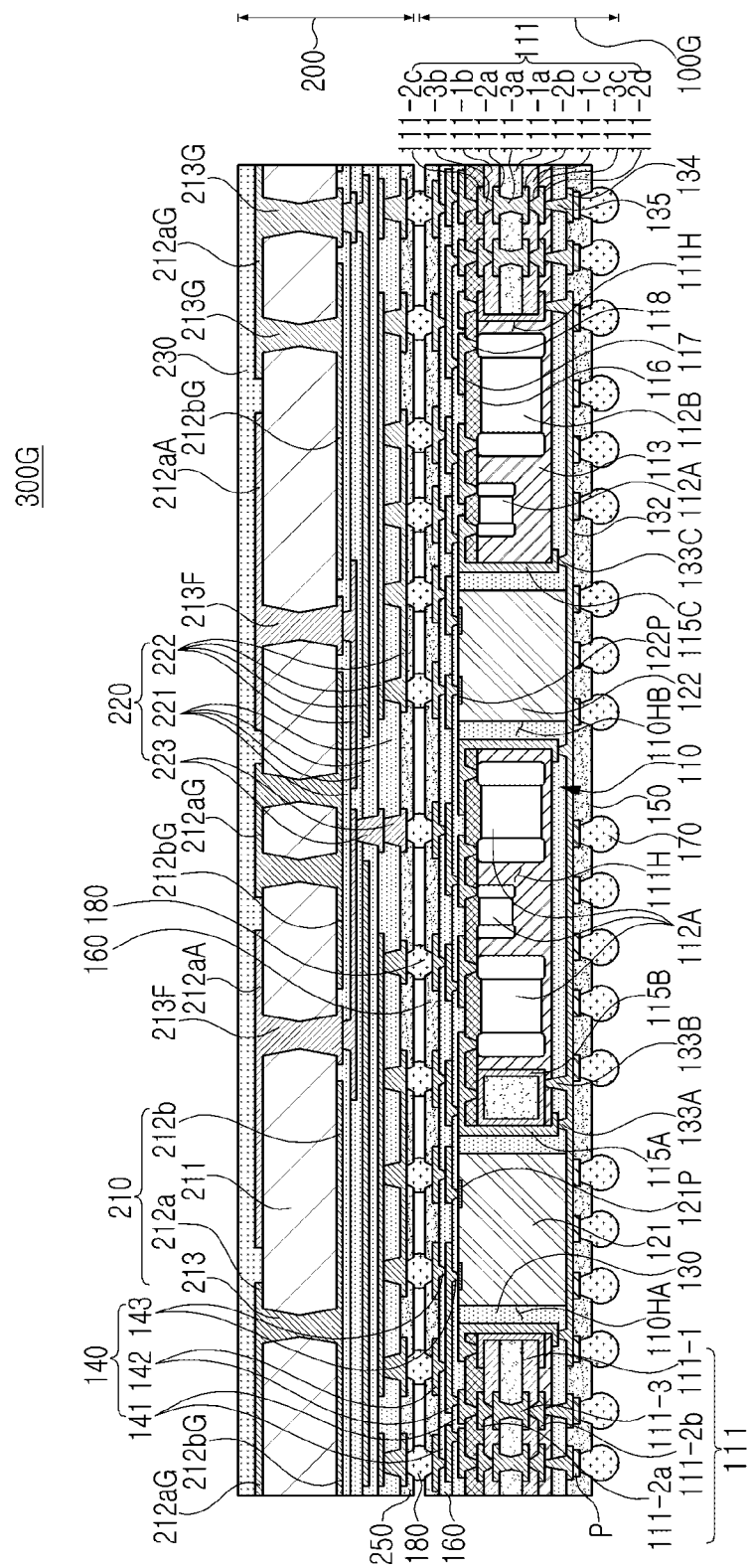
FIG. 24 is a schematic cross-sectional view illustrating another example of an antenna module.

FIG. 24 is a schematic cross-sectional view illustrating another example of an antenna module.

Referring to the drawings, in an antenna module 300G according to another example, a frame 111 of a semiconductor package 100G may include a core layer 111-1a, a first core wiring layer 111-2a and a second core wiring layer 111-2b disposed on both surfaces of the core layer 111-1a, a first build-up layer 111-1b disposed on the first core wiring layer 111-2a and covering the first core wiring layer 111-2a, a first build-up wiring layer 111-2c disposed on the first build-up layer 111-1b, a second build-up layer 111-1c disposed on the core layer 111-1a and covering the second core wiring layer 111-2b, and a second build-up wiring layer 111-2d disposed on the second build-up layer 111-1c. The first and second core wiring layers 111-2a and 111-2b, and the first and second build-up wiring layers 111-2c and 111-2d may be electrically connected to first and second connection pads 121P and 122P. The first and second core wiring layers 111-2a and 111-2b, and the first and second build-up wiring layers 111-2c and 111-2d may be electrically connected to each other, through a core wiring via layer 111-3a, and first and second build-up wiring via layers 111-3b and 111-3c passing through the core layer 111-1a and the first and second build-up layers 111-1b and 111-1c, Respectively. First and second inactive surfaces of first and second semiconductor chips 121 and 122 may be physically connected to a metal pattern layer 132, and may be coplanar with a surface of a second encapsulant 130 in contact with the metal pattern layer 132.

Since other configurations may be substantially the same as those described with reference to FIGS. 9 to 23, a detailed description thereof will be omitted.

Figure 25:
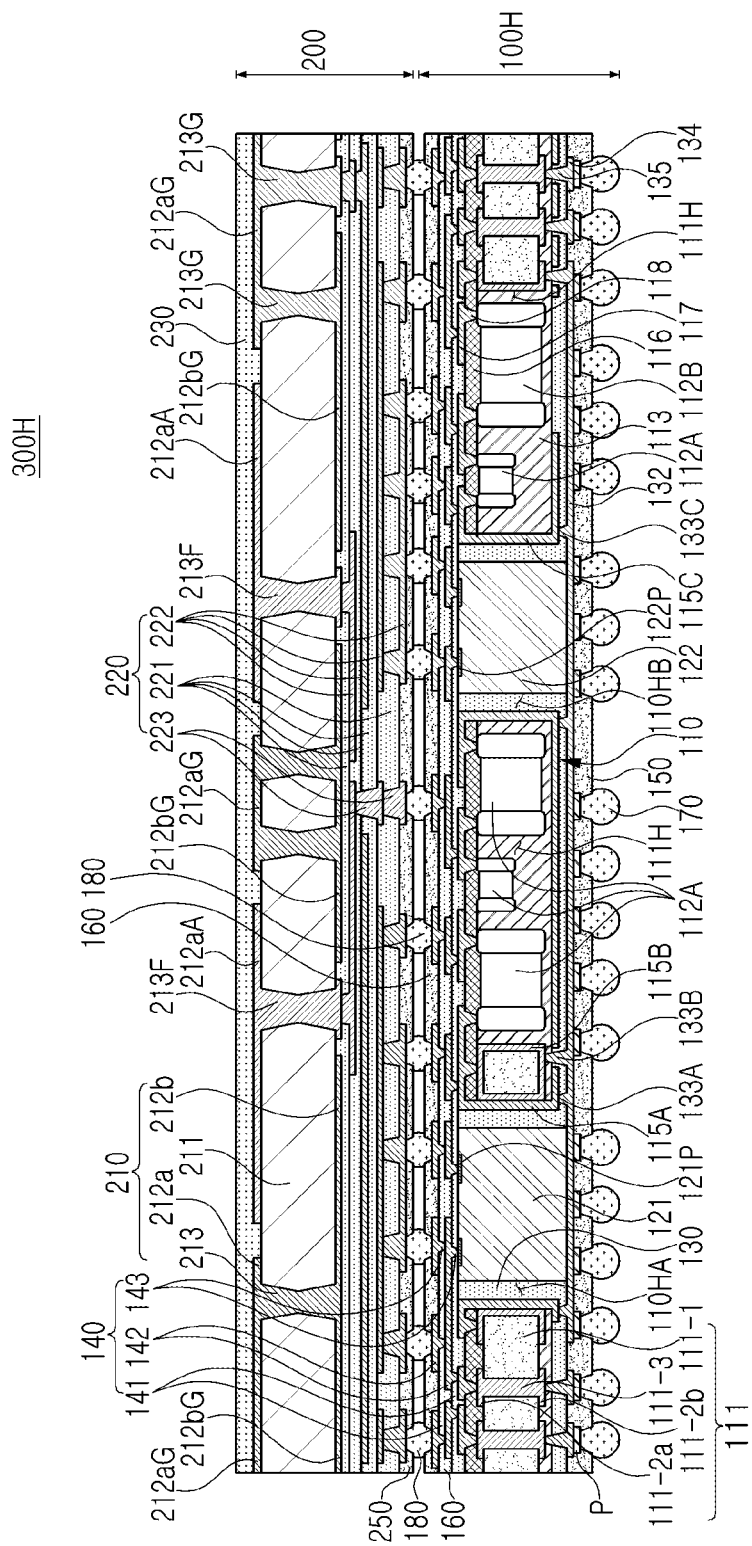
FIG. 25 is a schematic cross-sectional view illustrating another example of an antenna module.

FIG. 25 is a schematic cross-sectional view illustrating another example of an antenna module.

Referring to the drawings, in an antenna module 300H according to another example, first and third metal layers 115A and 115C of a semiconductor package 100H may be selectively extended on a first encapsulant 113 to cover a region directly above a first passive component 112A, not to cover a region directly above a second passive component 112B. At least one of first and third metal vias 133A and 133C may connect the first and third metal layers 115A and 115C to a metal pattern layer 132 in the region directly above the first passive component 112A. The first passive component 112A may be a capacitor, and the second passive component 112B may be an inductor. For example, the region directly above the first passive component 112A, which may be particularly required to generate heat, may be selectively covered with a metal material, and may effectively dissipate the heat through the metal vias. In the case of the second passive component 112B which needs to be spaced apart from the metal material, the region directly above may be not covered with the metal material. First and second inactive surfaces of first and second semiconductor chips 121 and 122 may be physically connected to the metal pattern layer 132, and may be coplanar with a surface of a second encapsulant 130 in contact with the metal pattern layer 132.

Since other configurations may be substantially the same as those described with reference to FIGS. 9 to 24, a detailed description thereof will be omitted. The semiconductor package 100H of the antenna module 300H described in FIG. 25 may be combined with the semiconductor packages 100F and 100G of the antenna modules 300F and 300G described in FIGS. 23 and 24.

The expression "coupled to" used in the present disclosure may be a concept including a case in which two components are integrated to be in contact with each other and a case in which two components are stacked by using a medium.

The expression 'examples' used in the present disclosure is provided in order emphasize and describe different unique features of various embodiments. However, the above suggested examples may also be implemented to be combined with a feature of another example. For example, even though a content described with respect to an example is not described in another example, it may be understood as a description related to another example unless described to the contrary or contradictory in another example.

The term of "connect" or "connection" in the present disclosure may be not only a direct connection, but also a concept including an indirect connection through an adhesive layer or the like. In addition, the term "electrically connected" or "electrical connection" is a concept including both a physical connection and a physical non-connection. Also, the expressions of "first," second," etc. are used to distinguish one component from another, and do not limit the order and/or importance of the components. In some cases, without departing from the spirit of the present disclosure, the first component may be referred to as a second component, and similarly, the second component may be referred to as a first component.

In the present disclosure, the words lower, lower portion, lower surface, and the like are used to refer to the downward direction (in the vertical direction of the drawings, also referred to as the thickness direction) with respect to the cross section of the drawing for convenience, while the words upper, upper portion, upper surface, and the like are used to refer to a direction opposite thereto. It should be understood that, the definitions refer to directions for convenience of explanation, the scope of the claims is not particularly limited by the description of such directions, and the concepts of the upward/downward directions may be changed at any time According to an aspect of the present disclosure, a semiconductor package and an antenna module, capable of effectively shielding electromagnetic interference between different types of blocks while including a plurality of chips and components, simultaneously improving a heat dissipation effect, minimizing design of a signal path between the antenna and the antenna, securing omnidirectional coverage characteristics, and improving antenna reception sensitivity, may be provided.

While examples have been illustrated and described above, it will be apparent to those skilled in the art that modifications and variations could be made without departing from the scope of the present disclosure as defined by the appended claims.

What is claimed is:

1. A method of manufacturing a semiconductor package, the method comprising:
forming a frame including a core layer having an opening;
forming a first metal layer by performing a first plating process on at least one surface of the core layer exposed through the opening;

forming a first encapsulant filling at least a portion of the opening in which passive components are disposed after disposing the passive components in the opening of the core layer;

forming an insulation layer on the first metal layer, the passive components, and the first encapsulant, a wiring via penetrating the insulation layer, and a wiring layer connected to the wiring via;

forming a first through-hole and a second through-hole penetrating the insulation layer and the first encapsulant;

forming a second metal layer and a third metal layer by performing a second plating process on at least one surface of the first through-hole and at least one surface of the second through-hole, respectively;

forming a second encapsulant filling at least a portion of the first through-hole and the second through-hole in which a first semiconductor chip and a second semiconductor chip are disposed after disposing the first semiconductor chip and the second semiconductor chip in the first through-hole and the second through-hole, respectively;

forming a first metal via and a second metal via penetrating the second encapsulant and a metal pattern layer on the second encapsulant; and forming a connection structure on the frame, the first semiconductor chip and the second semiconductor chip, the connection structure including redistribution layers electrically connected to the first semiconductor chip and the second semiconductor chip and the passive components, wherein the first metal layer and the second metal layer respectively are formed to extend to a surface of each of the first encapsulant and the frame, facing the metal pattern layer, and wherein the first metal layer and the second metal layer are connected to the metal pattern layer through the first metal via and the second metal via having heights different from each other.

2. The method of manufacturing the semiconductor package according to claim 1, wherein the second encapsulant covers the surface of the first encapsulant, facing the metal pattern layer, wherein the first metal via penetrates the second encapsulant, wherein the second metal via penetrates the first encapsulant and the second encapsulant, and wherein the second metal via is higher than the first metal via.

3. The method of manufacturing the semiconductor package according to claim 1, wherein the first semiconductor chip has a first active surface on which a first connection pad is disposed, and a first inactive surface opposite to the first active surface, wherein the second semiconductor chip has a second active surface on which a second connection pad is disposed, and a second inactive surface opposite to the second active surface, wherein the connection structure is disposed on the second active surface, and wherein the redistribution layers are electrically connected to the first connection pad and the second connection pad respectively.

4. The method of manufacturing the semiconductor package according to claim 3, wherein the metal pattern layer is disposed on the second encapsulant to cover a region directly above each of the first inactive surface and the second inactive surface and a region directly above the passive components.

5. The method of manufacturing the semiconductor package according to claim 3, wherein the insulation layer is disposed on a surface of the passive components facing the connection structure, wherein the wiring via electrically connectes the wiring layer and the passive components, and wherein the first active surface and a surface of the wiring layer contacting the connection structure are coplanar with each other.

6. The method of manufacturing the semiconductor package according to claim 3, wherein the first inactive surface is physically in contact with the metal pattern layer, and is coplanar with a surface of the second encapsulant contacting the metal pattern layer.

7. The method of manufacturing the semiconductor package according to claim 1, wherein the third metal layer extends to the surface of the first encapsulant facing the metal pattern layer, wherein a third metal via connects the third metal layer to the metal pattern layer, wherein the third metal via penetrates the second encapsulant, and wherein the third metal via has a height substantially the same as the first metal via.

8. The method of manufacturing the semiconductor package according to claim 1, wherein at least a portion of the second metal layer constitutes an inner surface of the first through-hole, and wherein the first metal layer and the second metal layer are physically contacted with each other in the first through-hole.

9. The method of manufacturing the semiconductor package according to claim 1, wherein the first metal layer and the third metal layer are physically spaced apart from each other in the opening.

10. The method of manufacturing the semiconductor package according to claim 1, wherein the first semiconductor chip comprises a radio frequency integrated circuit (RFIC), wherein the second semiconductor chip comprises a power management integrated circuit (PMIC), and wherein the passive components comprise at least one of an inductor and a capacitor.

11. The method of manufacturing the semiconductor package according to claim 10, wherein the passive components comprise the inductor and the capacitor, wherein the second metal layer and the third metal layer extend onto the first encapsulant to cover a region directly above the capacitor and not to cover a region directly above the inductor, wherein the second metal via connects the second metal layer to the metal pattern layer in the region directly above the capacitor or a third metal via connects the third metal layer to the metal pattern layer in the region directly above the capacitor, wherein the third metal via passes through the second encapsulant, and wherein the third metal via has a height substantially the same as the first metal via.

12. The method of manufacturing the semiconductor package according to claim 1, wherein the frame further including a plurality of wiring layers, wherein the plurality of wiring layers of the frame are electrically connected to the redistribution layers, and wherein at least one of the plurality of wiring layers of the frame is embedded in the frame.

13. The method of manufacturing the semiconductor package according to claim 12, further comprising:
forming a backside wiring layer disposed on the second encapsulant and side by side with the metal pattern layer; and
forming a backside wiring via electrically connecting the plurality of wiring layers of the frame to the backside wiring layer,
wherein the backside wiring via has the same height as the first metal via.

14. The method of manufacturing the semiconductor package according to claim 13, further comprising:
forming a plurality of electrical connection metals disposed on the backside wiring layer and electrically connecting the metal pattern layer and the backside wiring layer to each other,
wherein a portion of the plurality of electrical connection metals are arranged in a fan-out area.

15. A method of manufacturing an antenna module, the method comprising:
forming the semiconductor package according to the method of claim 1; and
forming an antenna substrate disposed on the semiconductor package,
wherein the antenna substrate comprises a wiring structure including a feed pattern, and an antenna structure disposed on the wiring structure and including an antenna pattern and a ground pattern, and
wherein the semiconductor package and the antenna substrate are connected to each other through a plurality of electrical connection metals disposed between the connection structure and the wiring structure.

16. The method of manufacturing the antenna module according to claim 15, wherein the antenna structure comprises:
a dielectric layer;
a first pattern layer disposed on a surface opposite to a surface of the dielectric layer facing the wiring structure, and including the antenna pattern;
a second pattern layer disposed on the surface of the dielectric layer facing the wiring structure; and
a conductor via layer including a feed line via passing through the dielectric layer and electrically connected to the antenna pattern.

17. A method of manufacturing a semiconductor package, the method comprising:
forming a core structure, in which a first semiconductor chip, a second semiconductor chip, and passive components are embedded;
forming a connection structure disposed on a first side of the core structure, the connection structure covering the first semiconductor chip, the second semiconductor chip, and the passive components, and including a redistribution layer electrically connected to a first connection pad of the first semiconductor chip, a second connection pad of the second semiconductor chip, and the passive components; and
forming a metal pattern layer disposed on a second side of the core structure opposing the first side, the metal pattern layer covering the first semiconductor chip, the second semiconductor chip, and the passive components,
wherein the core structure includes:
a first metal layer surrounding side surfaces of the first semiconductor chip,
a second metal layer contacting the first metal layer and surrounding the side surfaces of the first semiconductor chip,
a third metal layer surrounding the passive components and side surfaces of the second semiconductor chip, and
a fourth metal layer spaced apart from the third metal layer and surrounding the side surfaces of the second semiconductor chip, and
the metal pattern layer is electrically connected to each of the first to fourth metal layers.

18. The method of manufacturing the semiconductor package according to claim 17, wherein a thickness of the first metal layer and a thickness of the third metal layer are substantially the same as each other, and
wherein a thickness of the second metal layer and a thickness of the fourth metal layer are substantially the same as each other.

19. The method of manufacturing the semiconductor package according to claim 17, wherein a sum of a thickness of the first metal layer and a thickness of the second metal layer is greater than a thickness of the third metal layer and a thickness of the fourth metal layer.

20. The method of manufacturing the semiconductor package according to claim 17, wherein the first metal layer and the third metal layer are connected to each other by a first metal extension portion disposed on a lower surface of a frame of the core structure, and
the semiconductor package further comprises:
a first via connecting the metal pattern layer to the first metal extension portion;
a second via connecting the metal pattern layer to a second metal extension portion of the second metal layer disposed on a lower surface of the core structure; and
a third via connecting the metal pattern layer to a third metal extension portion of the third metal layer disposed on the lower surface of the core structure.

* * * * *